(12) United States Patent
Kojima

(10) Patent No.: US 7,369,415 B2
(45) Date of Patent: May 6, 2008

(54) MULTILAYER ELECTRONIC CIRCUIT DEVICE

(75) Inventor: Akiyoshi Kojima, Kariya (JP)

(73) Assignee: DENSO CORPORATION, Kariya (JP)

( * ) Notice: Subject to any disclaimer, the term of this patent is extended or adjusted under 35 U.S.C. 154(b) by 185 days.

(21) Appl. No.: 11/032,137

(22) Filed: Jan. 11, 2005

(65) Prior Publication Data

US 2005/0174748 A1 Aug. 11, 2005

(30) Foreign Application Priority Data

Jan. 14, 2004 (JP) ............................. 2004-007238
Oct. 29, 2004 (JP) ............................. 2004-315777

(51) Int. Cl.
*H01R 12/16* (2006.01)
(52) U.S. Cl. ........................ 361/789; 361/749; 361/790
(58) Field of Classification Search ................ 361/749, 361/790; 174/254–255
See application file for complete search history.

(56) References Cited

U.S. PATENT DOCUMENTS 5,481,134 A * 1/1996 Sobhani et al. ............. 257/686
5,776,797 A * 7/1998 Nicewarner et al. ........ 438/107

FOREIGN PATENT DOCUMENTS

| JP | 5-335714 | 12/1993 |
|---|---|---|
| JP | 2003-229678 | 8/2003 |

* cited by examiner

*Primary Examiner*—Tuan T. Dinh
(74) *Attorney, Agent, or Firm*—Posz Law Group, PLC

(57) ABSTRACT

An electronic control device includes a multilayered flexible substrate and first to fourth spacers disposed in a casing. The multilayered flexible substrate, including first to third rigid substrate portions, is folded in a multilayered arrangement in such a manner that each rigid substrate portion is sandwiched between two spacers. The first rigid substrate portion is disposed at the lowest position to arrange a lowermost layer. The second rigid substrate portion is folded upward relative to the first flexible portion by 180 degrees to arrange an intermediate layer. The third rigid substrate portion is folded upward relative to the second flexible portion by 180 degrees to arrange an uppermost layer. The card edge connectors are laminated or layered with predetermined gaps and positioned in a case opening.

36 Claims, 19 Drawing Sheets

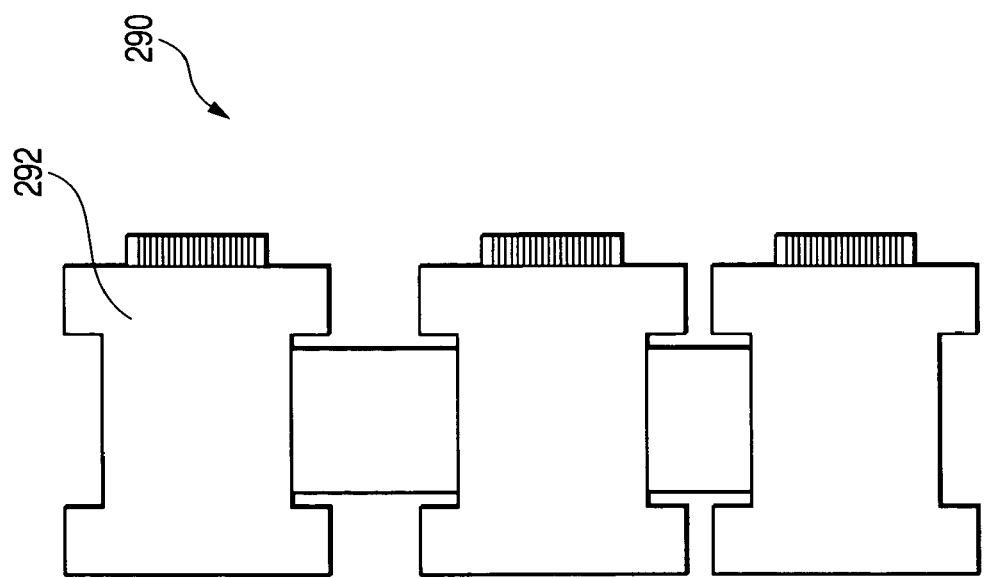
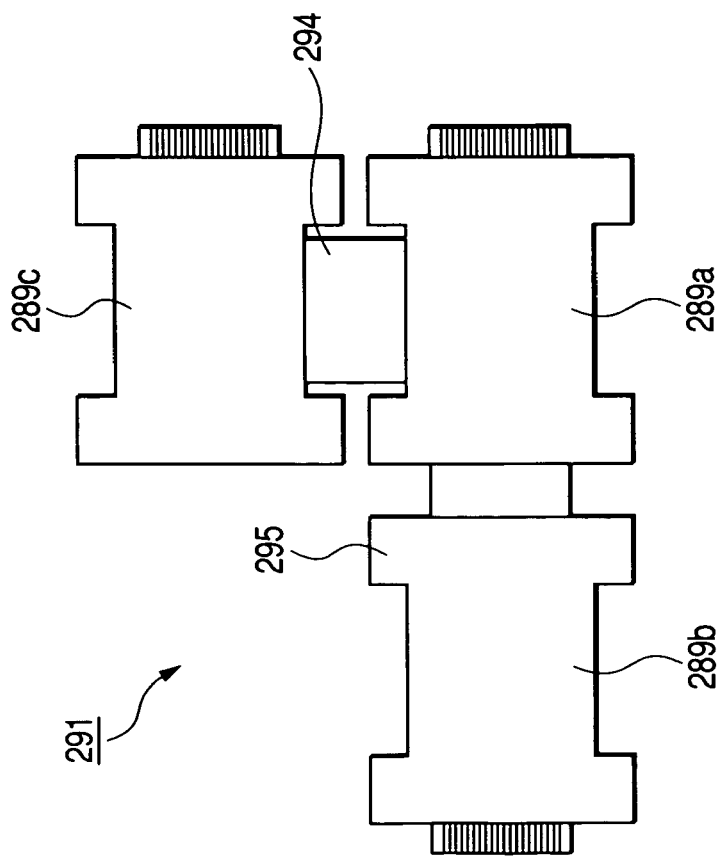
FIG. 23B
FIG. 23A

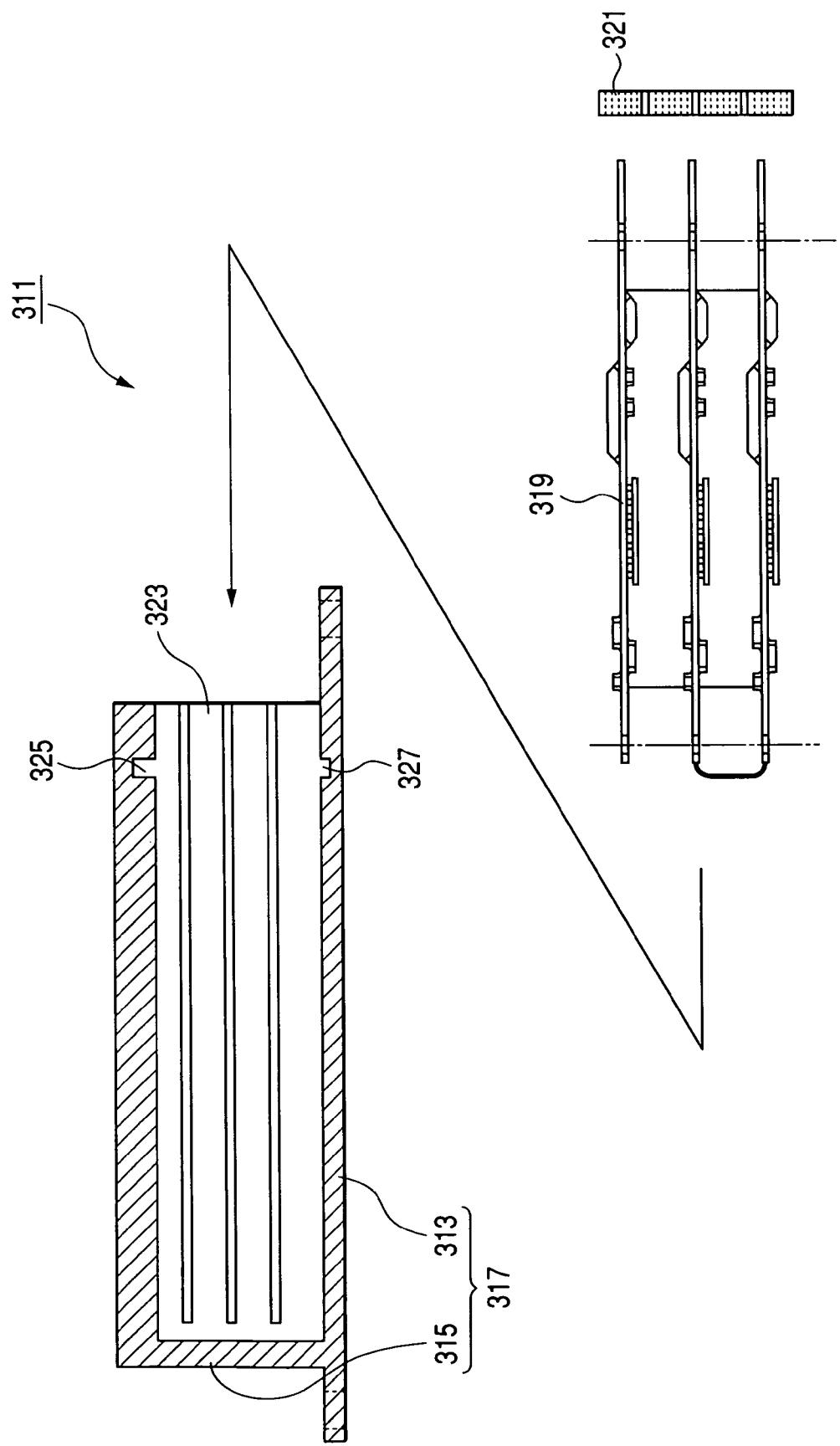

MULTILAYER ELECTRONIC CIRCUIT DEVICE

CROSS-REFERENCE TO RELATED APPLICATION

This application is based upon and claims the benefit of priority from earlier Japanese Patent Application No. 2004-7238 filed on Jan. 14, 2004 and the Japanese Patent Application No. 2004-315777 filed on Oct. 29, 2004 so that the descriptions of which are incorporated herein by reference.

BACKGROUND OF THE INVENTION

The present invention relates to an electronic control device having a casing accommodating a circuit substrate used for the control of an automotive vehicle or the like.

FIG. 25 shows a conventional electronic control device installed in an automotive vehicle or the like for various controls (refer to the Japanese Patent Application Laid-open No. 2003-229678). This electronic control device P1 includes electronic components P2 and a heat sink P3 mounted on a circuit substrate P4 which are housed in a casing P5. A connector P6, as a separate member, is attached to the edge of the circuit substrate P4.

However, according to the above-described conventional electronic control device, the connector has a complicated arrangement and a large number of parts. Accordingly, the cost of this conventional device is high. Meanwhile, to respond to increasing requirements for various controls, the connector must have multiple electrodes. However, according to the conventional electronic control device, there will be no way to respond to such a requirement other than separately providing a larger multi-electrode connector. As a result, the arrangement of the device will be further complicated. The cost will increase. The size of the electronic control device will become bigger.

Furthermore, to respond to the requirements of the multi-electrode connector, it may be possible to downsize the connector by thinning the connector pins or reducing the gap between the connector pins. However, in such a case, there will be other problems such as a larger current drive control being unfeasible and the size of a connector casing is restricted.

In short, the conventional arrangement using a separate connector is not preferable in realizing effective downsizing of an electronic control device.

SUMMARY OF THE INVENTION

In view of the above-described problems, the present invention has an object to provide an electronic control device capable of realizing a multi-electrode arrangement without increasing the size of the device.

In order to accomplish the above and other related objects, the present invention provides an electronic control device including a casing accommodating a multilayered flexible substrate. The multilayered flexible substrate includes a plurality of rigid substrate portions and flexible portions. The rigid substrate portions mount electronic components thereon. The flexible portions are flexible and bendable compared with the rigid substrate portions. The flexible portions provide an electrical connection between the rigid substrate portions. Card edge connectors are integrally formed with the rigid substrate portions along outer peripheral edges of the rigid substrate portions. And, the multilayered flexible substrate is folded at the flexible portions so that the rigid substrate portions are disposed in a thickness direction so as to form a multilayered arrangement.

According to the present invention, the multilayered flexible substrate is folded at the flexible portions so as to form a multilayered arrangement of the rigid substrate portions (equipped with the card edge connectors at their edges). The connector arrangement is simple. The number of parts is small. The cost is low.

Furthermore, according to the present invention, the card edge connectors are provided at respective rigid substrate portions and the rigid substrate portions are disposed to form a multilayered arrangement. Therefore, the electronic control device of this invention can provide a multi-electrode connector arrangement capable of satisfying the increasing requirements for various controls. Furthermore, the electronic control device itself is compact.

The card edge connectors are provided at all of the rigid substrate portions. It is however possible to provide the card edge connectors only on two or more rigid substrate portions. Furthermore, it is also possible to provide a plurality of card edge connectors on a single rigid substrate portion.

Furthermore, the multilayered arrangement of this invention chiefly represents a plurality of rigid substrate portions disposed or layered with predetermined gaps in a laminating direction. In the case of using insulating members disposed between the rigid substrate portions, no gap will be necessary. The surface of each rigid substrate portion is usually covered by an insulating resin layer.

Furthermore, the card edge connector of this invention is a plate connector integrally formed with an associated rigid substrate portion and extending outward from the edge of the rigid substrate portion in substantially the same direction.

According to the electronic control device of the present invention, it is preferable that the card edge connectors are provided on at least two rigid substrate portions. When the multilayered flexible substrate is folded to form a multilayered arrangement of the rigid substrate portions, the card edge connectors are arranged along their terminal directions so as to form a multilayered arrangement.

The present invention proposes an example of the multilayered arrangement of the card edge connectors which is preferable to realize the multi-electrode connector arrangement. The card edge connectors are attached beforehand along the outer peripheral edges of the multilayered flexible substrate. When the multilayered flexible substrate is folded and disposed to form a multilayered arrangement, the card edge connectors are arranged along their terminal directions. This arrangement requires a simple step of folding the multilayered flexible substrate. The card edge connectors can be easily disposed at desired positions (i.e. corresponding to a designated connector forming position of the electronic control device).

Furthermore, the terminal directions represent the directions of electrically conductive members extending to form the terminals. In other words, the terminal directions correspond to the direction along which a connector is inserted into or removed from the casing.

According to the electronic control device of the present invention, it is preferable that terminal directions of the card edge connectors provided on respective rigid substrate portions are differentiated for individual rigid substrate portions.

According to this arrangement, terminal directions of respective card edge connectors are differentiated in the electronic control device. The connector attaching/detaching direction can be arbitrarily changed considering various circuit functions (for example, input and output). As a result, the wiring length between the electronic control device and other devices installed in an automotive vehicle can be optimized It is possible to provide a plurality of card edge connectors on the same rigid substrate portion. For example, two or more card edge connectors can be provided at different sides of a rectangular rigid substrate portion.

According to the electronic control device of the present invention, it is preferable that the casing has a case opening at its edge so that the card edge connectors are exposed in the case opening.

With this arrangement, a connector can be easily engaged with the card edge connectors exposed in the case opening of the casing.

According to the electronic control device of the present invention, it is preferable that an alignment member (e.g. alignment plate) is disposed at the case opening so as to close the case opening, and respective card edge connectors extend out of the alignment member through a plurality of through-holes of the alignment member.

With this arrangement, the card edge connectors are inserted into the corresponding through-holes of the alignment member disposed at the case opening. The coupling between a connector and the casing is easy and smooth.

It is preferable to use a metallic alignment plate and maintain this metallic alignment plate at the ground potential (GND) to block any incoming noises. The alignment member can be inserted until it reaches a boundary between the region of the card edge connectors and the region of an insulating resin layer covering the surfaces of the rigid substrate portions.

According to the electronic control device of the present invention, it is preferable that spacers are disposed between respective rigid substrate portions.

With this arrangement, the spacers are disposed between respective rigid substrate portions (for providing a predetermined clearance between rigid substrate portions). The spacers can prevent the electronic components from colliding interfering with each other when these electronic components are mounted on respective rigid substrate portions. It is preferable to dispose a spacer between an uppermost or lowermost rigid substrate portion and the casing.

According to the electronic control device of the present invention, it is preferable that the spacers are resin-made spacers. The resin-made spacers are advantageous in weight and excellent in insulating properties.

According to the electronic control device of the present invention, it is preferable that a metallic collar (e.g. a cylindrical tube) is disposed in respective resin-made spacers so as to extend in a laminating direction of the resin-made spacers.

With this arrangement, the collar made of a metallic member can reinforce the resin-made spacer. For example, the collar is embedded in the resin-made spacer. The collar prevents the spacer from deforming when a pressing force acts on the spacer in the laminating direction. The electronic components mounted on respective rigid substrate portions are not damaged. Furthermore, the rigid substrate portions are accurately layered.

According to the electronic control device of the present invention, it is preferable that the spacers are metallic spacers. This arrangement proposes an example of a material preferable for the spacer. The metallic spacers do not deform easily when a pressing force acts on the spacer in the laminating direction. The electronic components mounted on respective rigid substrate portions are not damaged.

Furthermore, the rigid substrate portions are accurately layered. Furthermore, the metallic spacers are excellent in thermal conductivity. Thus, the metallic spacers can improve the heat-dissipating properties of the electronic control device.

Usually, an insulating resin layer covers a surface of the multilayered flexible substrate. Thus, no problems occur even when the metallic spacer is brought into contact with the insulating resin layer.

According to the electronic control device of the present invention, it is preferable that the spacers are plate members covering surfaces of the rigid substrate portions. This arrangement proposes an example of the shape preferable for the spacer. The metallic plate spacers covering the surfaces of the rigid substrate portions can prevent the electromagnetic interference occurring between electronic components layered in the up-and-down direction. Furthermore, the heat-dissipating properties of the electronic control device can be improved.

According to the electronic control device of the present invention, it is preferable that the spacers have recesses which do not interfere with electronic components mounted on the rigid substrate portions. This arrangement proposes an example of the shape preferable for the spacer. Using the spacer having an appropriate recess is effective in preventing the electronic components mounted on the rigid substrate portion from colliding and interfering with the spacer even when the spacer is directly disposed or layered on this rigid substrate portion. As a result, the electronic control device becomes compact.

It is also preferable that the casing has a recess provided on its inner surface. Providing such a recess on the casing is effective in preventing the mechanical interference between the casing and the electronic components.

According to the electronic control device of the present invention, it is preferable that electronic components are mounted on one surface of the rigid substrate portions and no electronic components are mounted on the other surface of the rigid substrate portions, and the metallic spacers are disposed so as to contact with the other surface of the rigid substrate portions.

With this arrangement, the metallic spacer can be directly layered on the surface of respective rigid substrate portions where no electronic components are mounted. The heat-dissipating properties of the electronic control device can be further improved.

According to the electronic control device of the present invention, it is preferable that the metallic spacers have a ground potential.

Maintaining the metallic spacers at the ground potential is effective in eliminating adverse effects of internal noises occurring in the electronic control device and external noises incoming into the electronic control device from the outside.

According to the electronic control device of the present invention, it is preferable that a clearance between the rigid substrate portions and the spacers is filled with a heat-dissipating gel.

Filling the clearance between the rigid substrate portions and the casing (and its recess) with the heat-dissipating gel is effective in improving the heat-dissipating properties of the electronic control device.

According to the electronic control device of the present invention, it is preferable that the electronic components are Si-back packaged components.

The Si-back packaged components can directly release the heat to the metallic spacers or the like. The heat-dissipating properties of the electronic control device can be improved.

According to the electronic control device of the present invention, it is preferable that electronic components having same or similar functions are mounted on the same rigid substrate portion so that electromagnetic interference occurring between the electronic components can be reduced.

For example, one rigid substrate portion mounts the electronic components relating to electric power supply, while another rigid substrate portion mounts electronic components relating to calculations. Separating the electronic components according to their power conditions or capacities is effective in suppressing the interference noises occurring between the electronic components and also reducing the interference noises occurring between the card edge connectors.

According to the electronic control device of the present invention, it is preferable that the casing is a resin-made casing. The resin-made casing is advantageous in weight.

According to the electronic control device of the present invention, it is preferable that the casing is a metallic casing.

For example, the metallic casing has excellent noise resistance when it is maintained at the GND potential.

According to the electronic control device of the present invention, it is preferable that the casing is a combination of a first casing member and a second casing member disposed in a laminating direction of the rigid substrate portions, and the multilayered flexible substrate is housed in a space defined by the first casing member and the second casing member.

This arrangement proposes an example of the arrangement for the casing. The first casing member and the second casing member are disposed in the laminating direction of respective rigid substrate portions and coupled integrally to arrange the casing. For example, the first casing member and the second casing member are a plate base on which the multilayered flexible substrate is mounted and a boxlike cover being put on this base so as to cover the multilayered flexible substrate.

The first casing member and the second casing member are not limited to particular configurations. The first casing member and the second casing member, when combined together, can define a space for accommodating the multilayered flexible substrate and form a case opening for receiving an external connector which is connected to the card edge connectors.

According to the electronic control device of the present invention, it is preferable that the first casing member and the second casing member are connected together with casing screw members extending across at least one of the first casing member and the second casing member.

This arrangement proposes an example of the arrangement for coupling the first casing member and the second casing member. For example, as shown in FIG. 1, the cover (or the base) has through-holes. The casing screw members are inserted into the through-holes of the cover (or base). The casing screw members are further inserted in the laminating direction of the rigid substrate portions until they reach the associated base (or cover). And then, the casing screw members are tightened into the screw holes to firmly integrate the base and the cover.

According to the electronic control device of the present invention, it is preferable that at least one spacer is disposed between the rigid substrate portions, and the spacer has spacer through-holes into which the casing screw members are inserted.

With this arrangement, positioning of the spacer is feasible by inserting the casing screw members into the spacer through-holes.

According to the electronic control device of the present invention, it is preferable that at least one spacer is disposed between the rigid substrate portions, and the rigid substrate portions have through-holes into which the casing screw members are inserted.

With this arrangement, positioning of the rigid substrate portions is easily feasible by inserting the casing screw members into the through-holes of the rigid substrate portions.

According to the electronic control device of the present invention, it is preferable that the first casing member has coupling projections or coupling recesses and the second casing member has coupling recesses or coupling projections, and the first casing member and the second casing member are connected by engaging the coupling projections or coupling recesses of the first casing member with the coupling recesses or coupling projections of the second casing member.

This arrangement proposes an example of the arrangement for connecting the first casing member and the second casing member. For example, the base has the coupling projections and the cover has the coupling recesses (as shown in FIG. 14) or vice versa. The base and the cover are coupled by engaging the coupling projections and the coupling recesses.

This arrangement requires no casing screw members. The coupling (or locking) and decoupling (unlocking) of the base and the cover is easy. The assembling work is easy. The productivity can be improved. No sealing rubber is required. The number of parts is small. The cost is low.

In this case, the coupling recesses include coupling holes and through-holes.

According to the electronic control device of the present invention, it is preferable that the rigid substrate portions are fixed to the casing with screw members.

This arrangement proposes an example of the arrangement for fixing the rigid substrate portions. More specifically, as shown in FIG. 14, the rigid substrate portions are fixed to the base or to the cover by tightening the screw members.

According to the electronic control device of the present invention, it is preferable that the casing has fixing projections provided on its inner surface and at least one of the rigid substrate portions is fixed to the casing via the fixing projections.

This arrangement proposes an example of the arrangement for fixing the rigid substrate portions. For example, as shown in FIG. 15, the fixing projections of the casing are inserted into through-holes of the rigid substrate portion and engaged with the rigid substrate portion. Thus, the rigid substrate portion can be firmly fixed to the base or to the cover.

According to the electronic control device of the present invention, it is preferable that at least one spacer is disposed between the rigid substrate portions, and the spacer has fixing projections for fixing at least one of the rigid substrate portions.

This arrangement proposes an example of the arrangement for fixing the rigid substrate portions. For example, as shown in FIG. 15, the fixing projections of the spacer are inserted into through-holes of the rigid substrate portion and engaged with the rigid substrate portion. Thus, the rigid substrate portion can be firmly fixed to the base or to the cover.

According to the electronic control device of the present invention, it is preferable that the casing has fixing projections provided on its inner surface, at least one spacer is disposed between the rigid substrate portions, and the spacer has engaging portions engageable with the fixing projections of the casing to fix the spacer to the casing.

As shown in FIG. 15, the fixing projections of the casing are engaged with the engaging portions (e.g. the engaging portions each consisting of a coupling hole and a cross hole) of the spacer. The spacer can be firmly fixed to the casing. For example, it is preferable to insert the fixing projections of the casing into the through-holes of the rigid substrate portion in a condition that the rigid substrate portion is disposed between the spacer and the casing. This simplifies the positioning of the rigid substrate portion.

According to the electronic control device of the present invention, it is preferable that at least one spacer is disposed between the rigid substrate portions, and the spacer is a metallic plate member bent into a crooked configuration for holding the rigid substrate portions.

This arrangement proposes an example of the arrangement for the spacer. As shown in FIG. 19, using the crooked metallic plate is effective in reducing the number of required spacers. The total number of parts can be reduced. The productivity can be improved. The cost is reduced.

According to the electronic control device of the present invention, it is preferable that spacers are disposed between the rigid substrate portions, and the spacers are members fixed beforehand on a surface of respective rigid substrate portions. As shown in FIG. 20, the spacers are provided beforehand on the rigid substrate portion by welding or the like. Accordingly, in the process of assembling the electronic control device, the step of disposing the spacers is no longer required. The workability can be improved.

Especially, in a case of performing the soldering operation, the process of mounting the electronic components and the process of bonding the spacers can be carried out as a sequential work. The workability can be further improved.

According to the electronic control device of the present invention, it is preferable that the casing has slide grooves provided on its inner surface to receive side edges of the rigid substrate portions.

As shown in FIG. 22, the side edges of the rigid substrate portions are forcibly coupled into the side grooves. The multilayered flexible substrate is accurately positioned in the casing. The workability is excellent.

As shown in FIGS. 23A and 23B, it is preferable to provide slide fixing flanges protruding from the side edges of the rigid substrate portion. The assembling of the electronic control device can be easily accomplished without causing any interference with the flexible portions.

According to the electronic control device of the present invention, it is preferable that the casing is an integrally formed member having a case opening at one end and slide grooves formed in its inner surface so that the rigid substrate portions are entered from the case opening and guided along the slide grooves.

As shown in FIG. 24, the entire body of the casing is integrally formed, for example, with a resin material. The number of parts is small. The workability in the assembling operation can be improved.

The casing can be made of a resin or metallic member

BRIEF DESCRIPTION OF THE DRAWINGS

The above and other objects, features and advantages of the present invention will become more apparent from the following detailed description which is to be read in conjunction with the accompanying drawings, in which:

FIG. 23A is a plan view explaining an unfolded state of a multilayered flexible substrate in accordance with the ninth embodiment of the present invention;

FIG. 23B is a plan view explaining an unfolded state of another multilayered flexible substrate in accordance with the ninth embodiment of the present invention;

FIG. 24 is a front cross-sectional view showing an exploded state of an electronic control device in accordance with a tenth embodiment of the present invention.

DESCRIPTION OF THE PREFERRED EMBODIMENTS

Preferred embodiments of the present invention will be explained hereinafter with reference to attached drawings.

Figure 1:
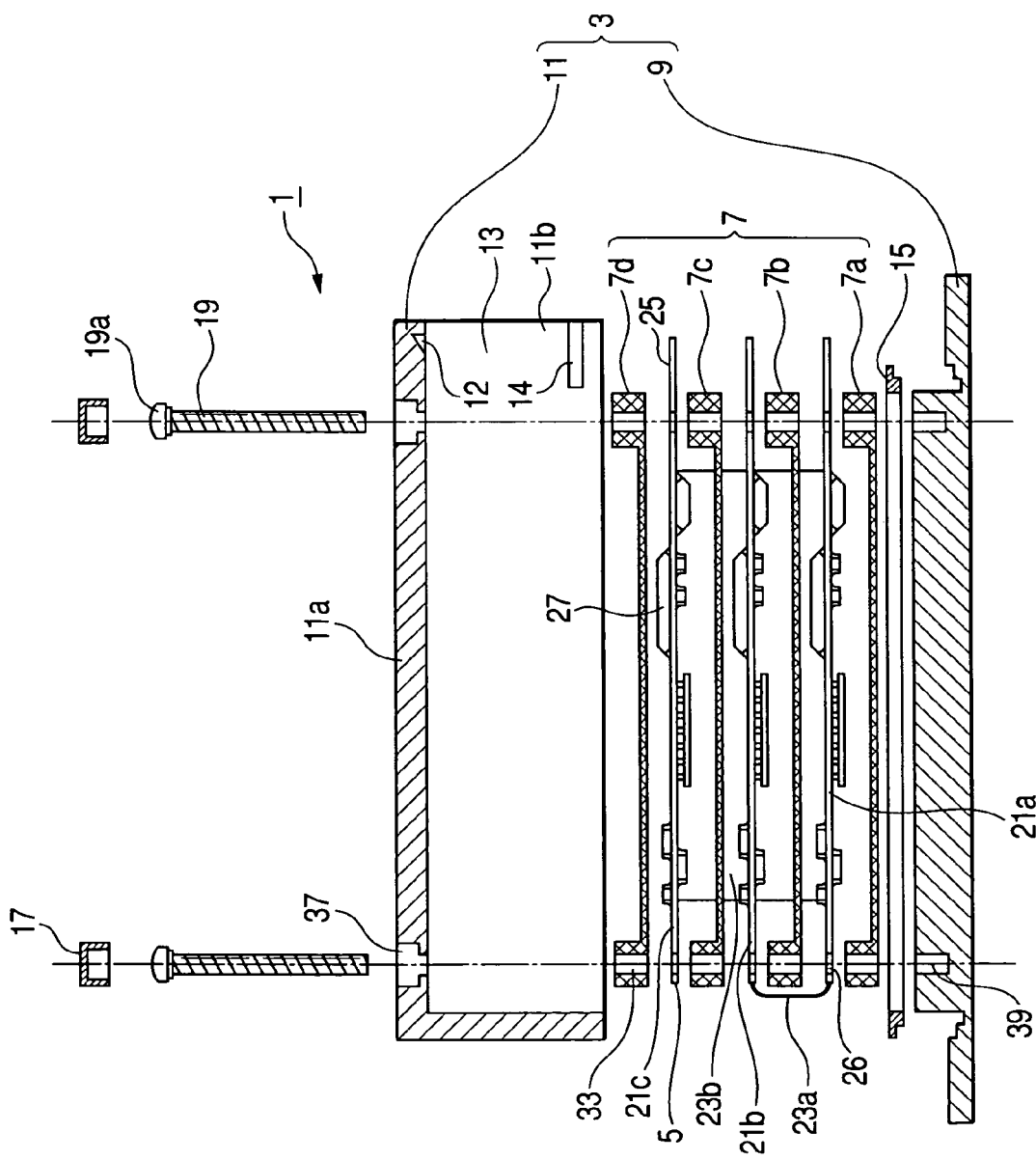
FIG. 1 is a front cross-sectional view showing an exploded state of an electronic control device in accordance with a first embodiment of the present invention.
Figure 2:
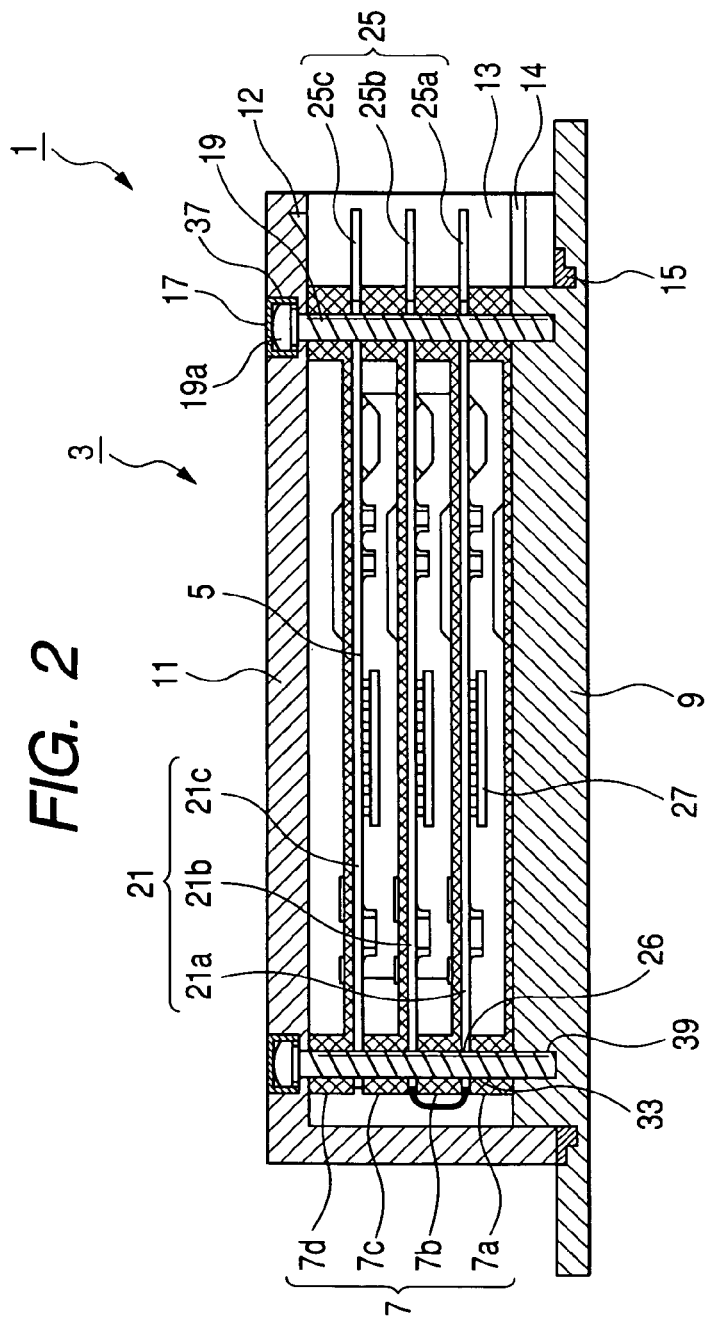
FIG. 2 is a front cross-sectional view showing an assembled condition of the electronic control device in accordance with the first embodiment of the present invention.

First Embodiment a) First of all, the arrangement of an electronic control device of a first embodiment will be explained. FIG. 1 is a front cross-sectional view showing an exploded state of an electronic control device in accordance with the first embodiment. FIG. 2 is a front cross-sectional view showing an assembled condition of the electronic control device in accordance with the first embodiment.

As shown in FIGS. 1 and 2, an electronic control device 1 includes a casing 3 configured into a rectangular parallelepiped. A multilayered flexible substrate 5 and a plurality of spacer 7a, 7b, 7c, and 7d (collectively referred to as spacer 7, hereinafter) are disposed in the casing 3.

Figure 3:
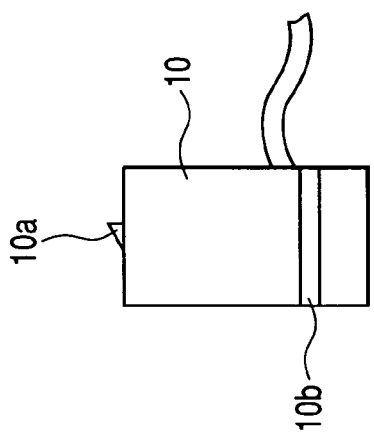
FIG. 3 is a side view explaining a side surface of an external connector in accordance with the first embodiment of the present invention.

The casing 3 includes a resin-made (or metallic) plate base 9 and a resin-made (or metallic) boxlike cover 11. The cover 11 is coupled with the plate base 9 from the upper surface side of the plate base 9. The casing 3 has a case opening 13 at one side surface (i.e. at the right side in the drawing). An external connector 10 (refer to FIG. 3) is inserted into the case opening 13 from the side and coupled with the casing 3.

The casing 3 includes a first sealing rubber member 15 which is configured into a rectangular frame shape and provided on the upper surface of the base 9, and also includes a total of four second sealing rubber members 17 each configured into a circular cap shape and provided on the upper surface side of the cover 11. The base 9, the first sealing rubber member 15, the spacer 7, the multilayered flexible substrate 5, and the cover 11 are integrated together and fixed by means of an appropriate number of (e.g. four) casing screw members 19. Each casing screw member 19 has a head portion 19a. The second sealing rubber member 17, coupled with a screw opening of the cover 11, conceals the head portion 19a of the casing screw member 19.

Furthermore, a coupling groove 12 is provided on an inner surface of a ceiling plate 11a of the cover 11 (i.e. on an inner surface of the case opening 13). The coupling groove 12 has a rectangular cross section and has an opening facing downward. An engaging projection 10a (refer to FIG. 3), provided on the top of the external connector 10, engages with the coupling groove 12 when the external connector 10 is inserted and coupled with the case opening 13. The external connector 10 is thus firmly fixed to the casing 3.

Furthermore, the cover 11 includes a pair of side plates 11b arranged in parallel with each other in a direction vertical to the sheet of FIG. 1. A connector slide groove 14, provided on an inner surface of the side plate 11b (i.e. on the inner surface of the case opening 13), extends in the right-and-left direction (i.e. in the horizontal direction) of FIG. 1. Each connector slide groove 14 receives a corresponding guide projection 10b (i.e. a guide projection 10b extending in the horizontal direction and protruding in the direction vertical to the sheet of FIG. 1; refer to FIG. 3) of the external connector 10. The engagement of the slide grooves 14 and the guide projections 10b have a function of guiding both side surfaces of the external connector 10 when the external connector 10 is coupled with the case opening 13. Thus, the external connector 10 can be smoothly coupled with the casing 3.

Furthermore, the casing 3 accommodates first to fourth resin-made spacers 7 laminated or layered in the up-and-down direction. The multilayered flexible substrate 5 is folded and disposed in such a manner that each of folded portions (i.e. rigid substrate portions) is sandwiched between two spacers 7. The multilayered flexible substrate 5, as readily understood from an unfolded state shown in FIG. 4A, consists of first to third rigid substrate portions 21a, 21b, and 21c (collectively referred to as rigid substrate portions 21, hereinafter) disposed as a whole in an L-shaped arrangement. Each rigid substrate portion 21 is made of a hard member and has a rectangular configuration. Sheet-like members provided between rigid substrate portions 21 are first and second flexible portions 23a and 23b (collectively referred to as flexible portions 23, hereinafter). The flexible portions 23 are flexible and bendable compared with the rigid substrate portions 21. Each flexible portion 23 provides an electrical connection between two rigid substrate portions 21. According to this embodiment, electronic components 27 are mounted on both upper and lower surfaces of each rigid substrate portion 21 (refer to FIG. 1).

The multilayered flexible substrate 5 is generally referred to as a rigid-flexible substrate which includes hard portions (i.e. rigid substrate portions 21) and soft portions (i.e. flexible portion 23). Each of the hard portions (i.e. rigid substrate portions 21) consists of numerous sheet members laminated into a hard plate member. Each of the soft portions (i.e. flexible portion 23) consists of a relatively small number of sheet-like members (compared with the rigid substrate portions 21).

Furthermore, the rigid substrate portions 21 have first to third card edge connector 25a, 25b, and 25c (collectively referred to as card edge connectors 25, hereinafter) formed along their edges (i.e. at one side of each rectangular body). The card edge connector 25 is a plate member protruding from the rigid substrate portion 21 with numerous terminals (made of electrically conductive layers) which are disposed in parallel with each other along one side of the rectangular body at only one or both surfaces thereof.

The multilayered flexible substrate 5 is folded at respective flexible portions 23 and is disposed as shown in FIG. 1. More specifically, the first rigid substrate portion 21a is disposed at the lowest position so as to arrange a lowermost layer. The second rigid substrate portion 21b is folded upward relative to the first flexible portion 23a by 180 degrees so as to arrange an intermediate layer (i.e. a second layer from the bottom). The third rigid substrate portion 21c is folded upward relative to the second flexible portion 23b by 180 degrees so as to arrange an uppermost layer. With this arrangement, all card edge connectors 25 are laminated or layered (with predetermined gaps between them) to form a multilayered arrangement positioned in the case opening 13 formed at the right side of FIG. 1. According to this embodiment, the right side of FIG. 1 is the terminal directions, i.e. the direction along which the external connector 10 is inserted into or pulled out of the casing 3.

Figure 4A:
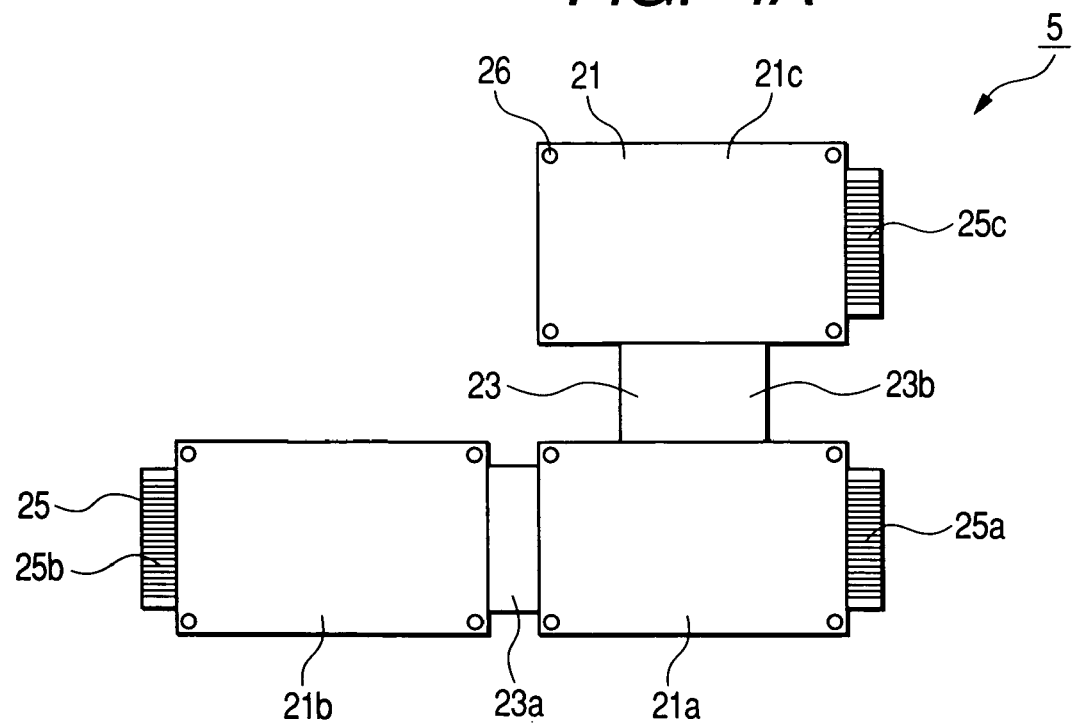
FIG. 4A is a plan view explaining an unfolded state of a multilayered flexible substrate in accordance with the first embodiment of the present invention.

FIG. 4A shows the arrangement of respective card edge connectors 25 relative to rigid substrate portions 21 according to which the card edge connectors 25 are positioned at the same side when the multilayered flexible substrate 5 is folded. Furthermore, each ridge portion 21 has a total of four substrate through-holes (substrate positioning holes) 26 at the four corners thereof. The multilayered flexible substrate 5 is folded and fixed by inserting the casing screw members 19 into the substrate through-holes 26 for positioning respective rigid substrate portions 21.

Figure 5:
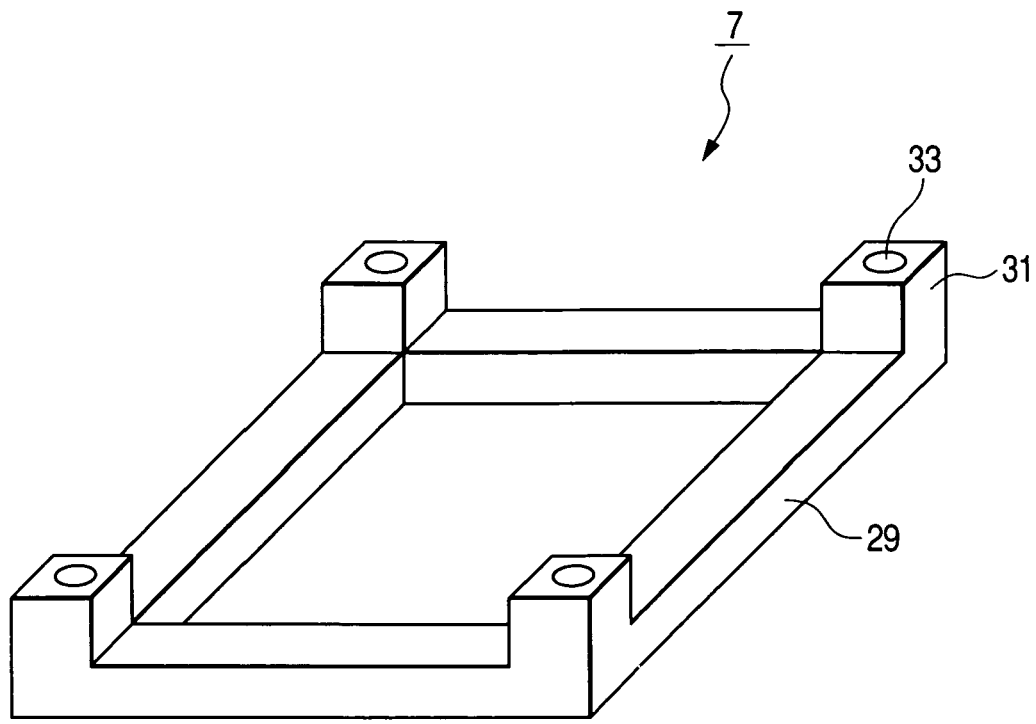
FIG. 5 is a perspective view showing a spacer in accordance with the first embodiment of the present invention.

Furthermore, as shown in FIG. 5, the spacer 7 is configured into a rectangular frame shape so as to fit to the inside surface of the casing 3 and the outer shape of respective rigid substrate portions 21. The spacer 7 consists of a rectangular frame portion 29 and four pillar portions 31 protruding upward from the four corners of the frame portion 29. Furthermore, each pillar portion 31 has a spacer through-hole 33 extending in the up-and-down direction at its center. The casing screw member 19 is inserted into the spacer through-hole 33.

Accordingly, the spacer 7, especially the pillar portions 31, provides predetermined gaps between respective rigid substrate portions 21 laminated or layered in a multilayered arrangement. The fourth spacer 7d provides a gap between the third rigid substrate portion 21c and the cover 11.

b) Next, the method for assembling the electronic control device 1 in accordance with this embodiment will be explained. According to this embodiment, when the multilayered flexible substrate 5 is installed in the casing 3, the first to fourth the spacers 7 are successively laminated or layered as shown in FIG. 1 and the multilayered flexible substrate 5 is folded at flexible portions 23 so that respective rigid substrate portions 21 are disposed between the spacers 7. The right and left edges of each rigid substrate portion 21 are mounted on the right and left sides of the frame portion 29 of the spacer 7.

According to this arrangement, electronic components 27 mounted on the lower surface of each rigid substrate portion 21 are housed in a space surrounded by the frame portion 29 of the spacer 7. Meanwhile, electronic components 27 mounted on the upper surface of each rigid substrate portion 21 are housed in a space defined by the pillar portions 31 of the spacer 7.

Then, as shown in FIG. 2, an assembly of the laminated or layered members is fixed by the casing screw members 19. More specifically, the base 9, the first sealing rubber member 15, the first spacer 7a, the first rigid substrate portion 21a, the second spacer 7b, the second rigid substrate portion 21b, the third spacer 7c, the third rigid substrate portion 21c, the fourth spacer 7d, and the cover 11 are successively laminated or layered in this order from the bottom and then fixed by the casing screw members 19.

More specifically, a worker or an automated machine can insert each casing screw member 19 into a corresponding hole portion 37 of the cover 11, the spacer through-hole 33 of respective spacers 7, the substrate through-holes 26 of respective rigid substrate portions 21 in this order. Then, the distal end of the casing screw member 19 reaches a screw hole 39 of the base 9. The worker or the automated machine tightens the casing screw member 19 into the screw hole 39. All of the laminated or layered members can be firmly fixed together, thereby obtaining the electronic control device 1 of this embodiment. The second sealing rubber member 17 is coupled with the head portion 19a of each casing screw member 19 and bonded by an appropriate adhesive.

c) In this manner, according to this embodiment, the multilayered flexible substrate 5 is folded at the flexible portions 23 so as to form a multilayered arrangement of the rigid substrate portions 21 each having the card edge connector 25 attached to the edge. Thus, compared with a conventional electronic control device using a separate connector, the connector arrangement is simple. The number of parts is small. The cost is low.

Furthermore, according to this embodiment, each rigid substrate portion 21 is provided with the card edge connector 25. Two or more rigid substrate portions 21 are disposed to form a multilayered arrangement. Respective card edge connectors 25, when the ridge portions 21 are disposed in a multilayered or multideck arrangement, have the same terminal directions. Therefore, the electronic control device of this embodiment can provide a multi-electrode connector arrangement capable of satisfying the increasing requirements for various controls. Furthermore, the electronic control device itself is compact.

Furthermore, according to this embodiment, the card edge connectors 25 are exposed in the case opening 13 and can be easily connected to the external connector 10.

In addition, according to this embodiment, the resin-made spacer 7 interposes between two rigid substrate portions 21. The resin-made spacer 7 effectively prevents the electronic components 27 mounted on respective rigid substrate portions 21 from colliding with each other.

Furthermore, the coupling groove 12 and the connector slide groove 14 both provided in the case opening 13 of the casing 3 can guide the slide movement of the inserted external connector 10 and ensure the engagement of the external connector 10 and the casing 3.

d) Furthermore, this embodiment can be modified in the following manner.

Figure 4B:
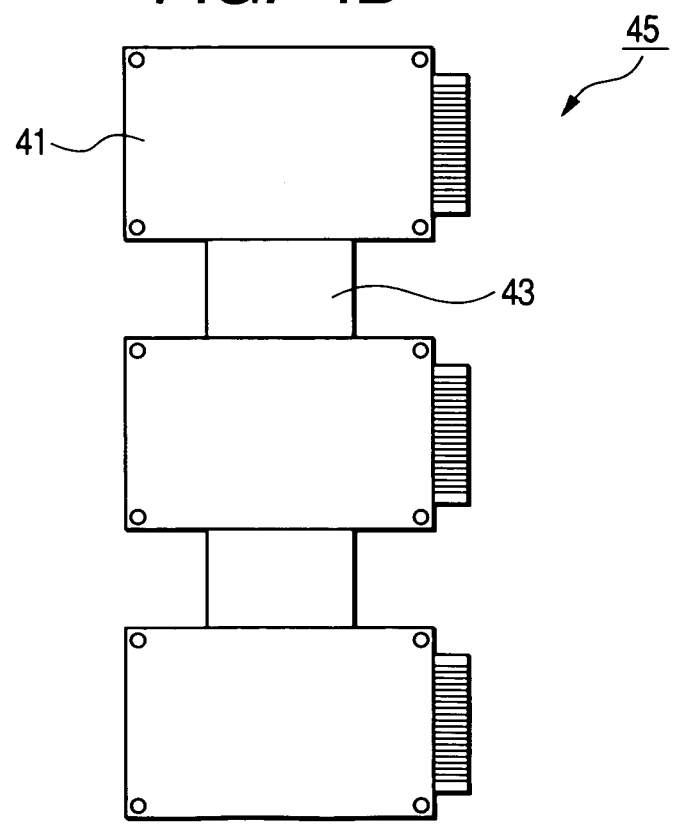
FIG. 4B is a plan view explaining an unfolded state of another multilayered flexible substrate in accordance with the first embodiment of the present invention.

For example, as shown in FIG. 4B, it is preferable to use a belt-like multilayered flexible substrate 45 consisting of the rigid substrate portions 41 and the flexible portions 43 disposed in a line. According to this modified embodiment, it is possible to form a multilayered arrangement of rigid substrate portions 41 by folding the multilayered flexible substrate 45 like the arrangement shown in FIG. 1.

Figure 6:
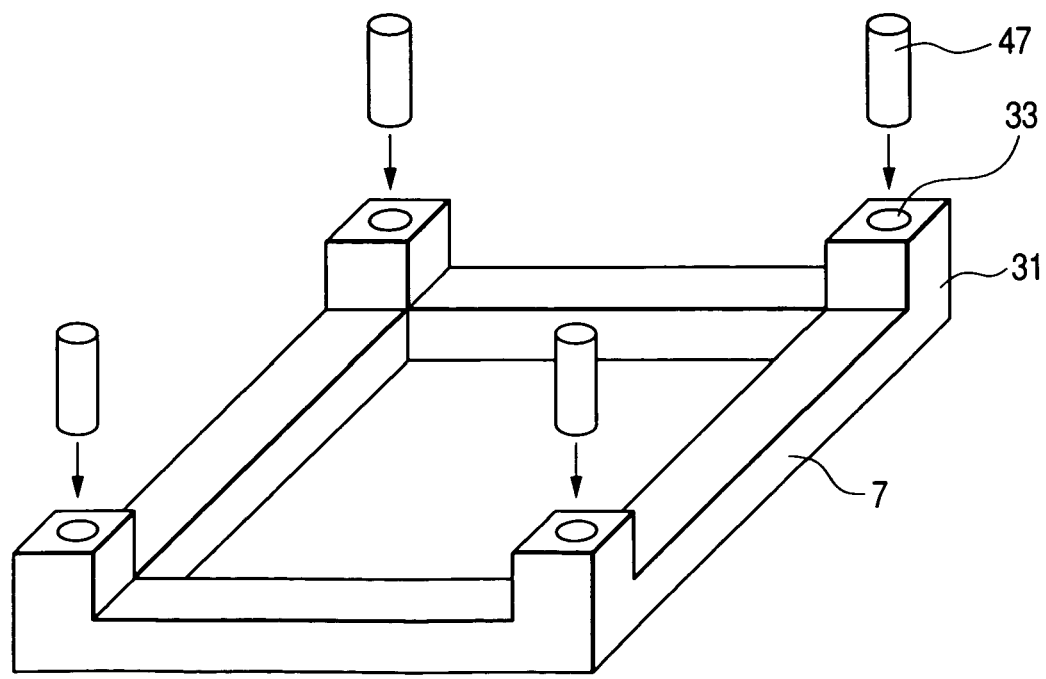
FIG. 6 is a perspective view showing another spacer in accordance with the first embodiment of the present invention.

Furthermore, as shown in FIG. 6, it is preferable to dispose a metallic collar (i.e. a cylindrical member) 47 in the spacer through-hole 33 of respective pillar portions 31 of the rectangular spacer 7. This arrangement can effectively suppress a deformation of the spacer 7 caused when a compression stress acts on the spacer 7 in the up-and-down direction.

Figure 7:
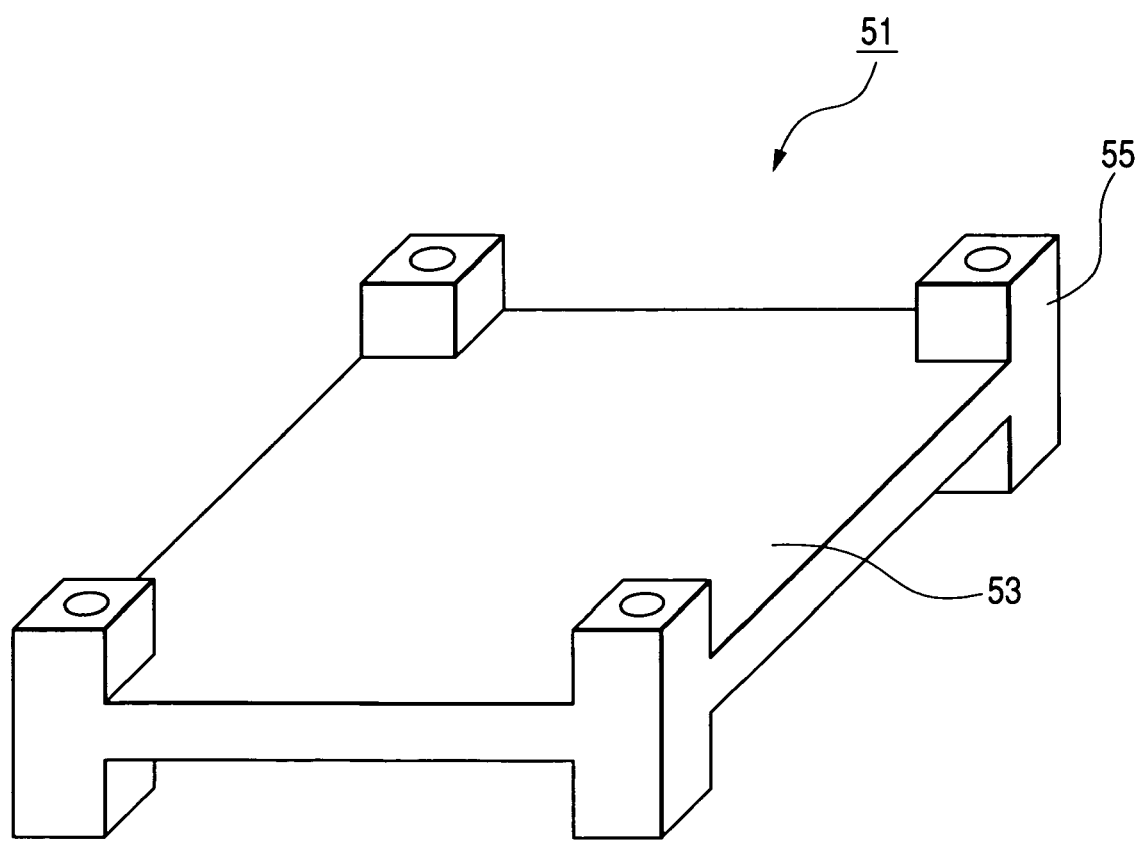
FIG. 7 is a perspective view showing yet another spacer in accordance with the first embodiment of the present invention.

Furthermore, as shown in FIG. 7, it is preferable to use a different spacer 51 consisting of a rectangular plate member 53 and pillar portions 55 protruding from the four corners of this plate member 53 in both up and down directions. This arrangement can secure a sufficient space at both sides of the plate member 53. It is thus possible to prevent the interference of electronic components even when numerous (or large) electronic components are mounted on both sides of respective rigid substrate portions.

Using the spacer 7 made of a metallic member is effective in enhancing the heat-dissipating properties of the spacer 7. In this case, the multilayered flexible substrate 5 is coated by a thin resin film so as to cover the surface of the substrate circuit. Thus, no short circuit occurs between the spacer 7 and the multilayered flexible substrate 5.

Second Embodiment

Figure 8:
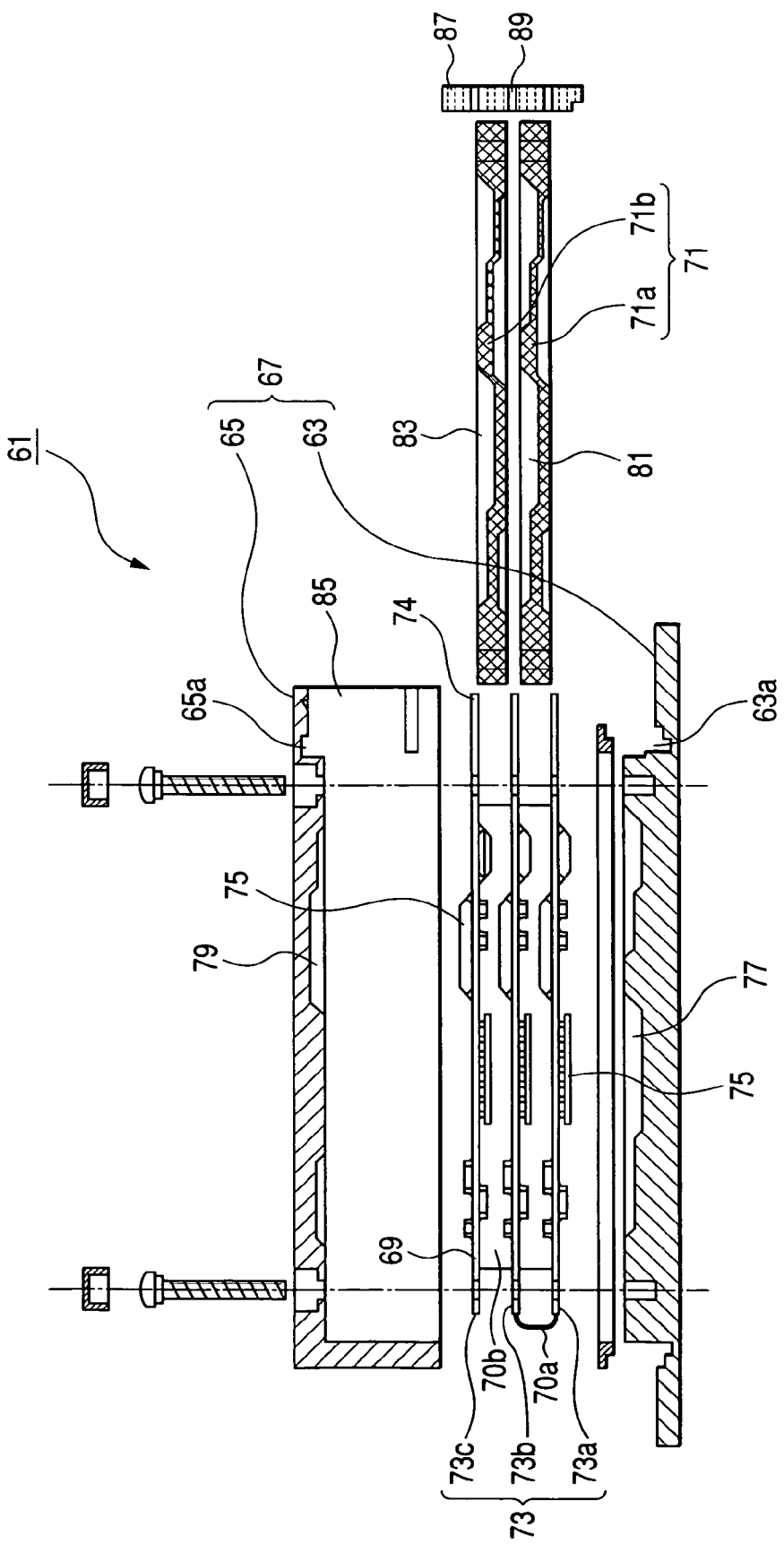
FIG. 8 is a front cross-sectional view showing an exploded state of an electronic control device in accordance with a second embodiment of the present invention.

Next, a second embodiment of the present invention will be explained, although some of the disclosure of the second embodiment is identical with those of the first embodiment and will not be explained again.

a) First, the arrangement of an electronic control device in accordance with the second embodiment will be explained. FIG. 8 is a front cross-sectional view showing an exploded state of the electronic control device in accordance with the second embodiment.

As shown in FIG. 8, an electronic control device 61 includes a casing 67 consisting of a base 63 and a cover 65. A multilayered flexible substrate 69 and a pair of spacers 71a and 71b (collectively referred to as spacers 71, hereinafter) are disposed in the casing 67.

According to this embodiment, the multilayered flexible substrate 69 is folded at flexible portions 70a and 70b (collectively referred to as flexible portions 70, hereinafter) so that first to third rigid substrate portions 73a, 73b, and 73c (collectively referred to as rigid substrate portions 73, hereinafter) and their card edge connectors 74 are disposed so as to form a multilayered arrangement.

Furthermore, the base 63 has at least one cavity portion (i.e. recess) 77 provided on its upper surface. The shape of this cavity portion 77 corresponds to the shape of electronic components 75 mounted on the lower surface of the first rigid substrate portion 73a of the multilayered flexible substrate 69. On the other hand, the cover 65 has at least one recess 79 provided on its lower surface. The shape of this recess 79 corresponds to the shape of electronic components 75 mounted on the upper surface of the third rigid substrate portion 73c of the multilayered flexible substrate 69.

According to this embodiment, each spacer 71 is a metallic plate member to be sandwiched between two rigid substrate portions 73. The first spacer 71a is directly placed on (i.e. brought into contact with) the first rigid substrate portion 73a. The second spacer 71b is directly placed on (i.e. brought into contact with) the second rigid substrate portion 73b. Furthermore, these spacers 71 have recesses 81 and 83 formed on their upper and lower surfaces. These recesses 81 and 83 effectively prevent the interference between the spacers 71 and the electronic components 75.

Figure 9:
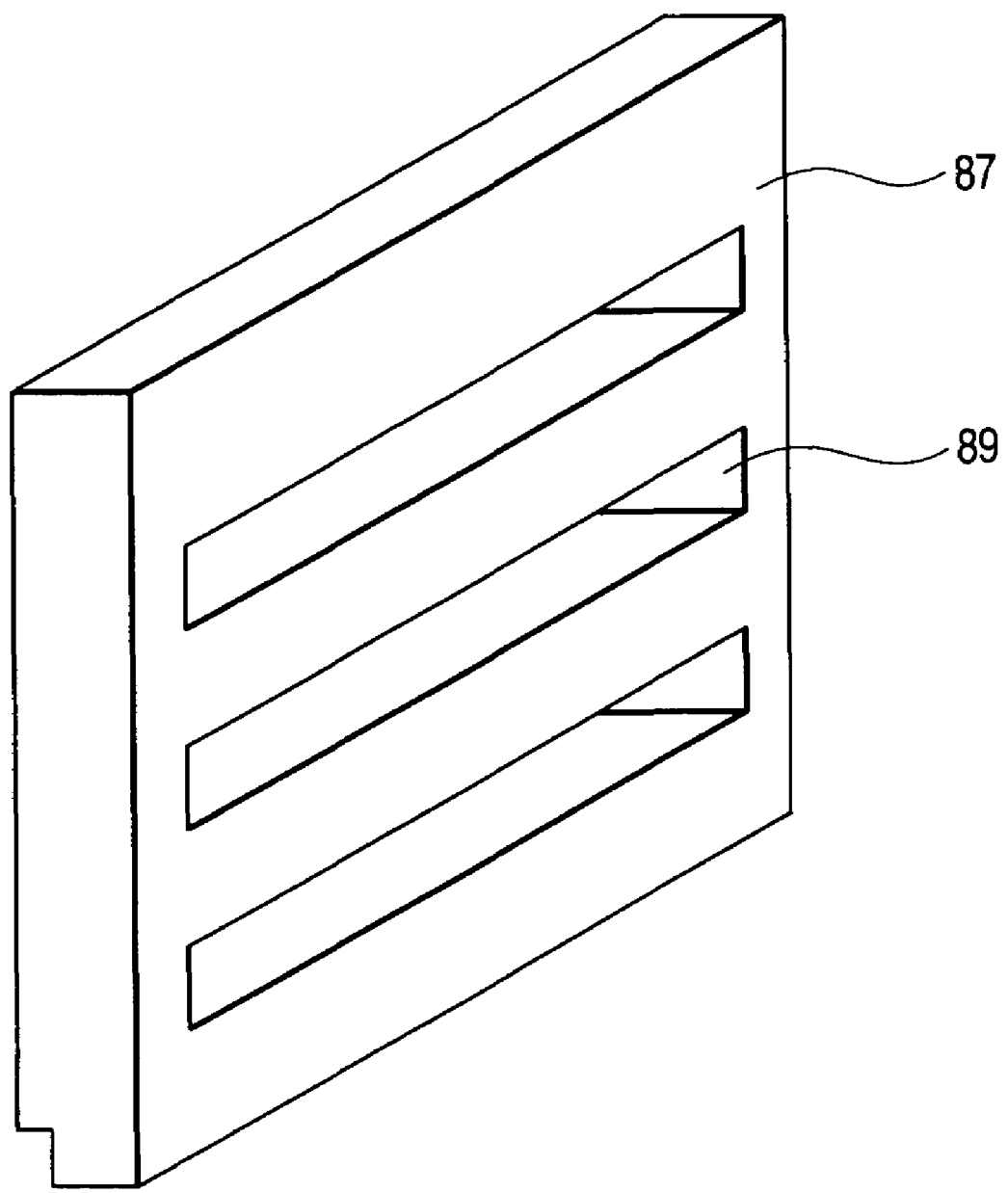
FIG. 9 is a perspective view showing an alignment plate in accordance with the second embodiment of the present invention.

The surface of each rigid substrate portion 73 is covered by an insulating resin layer. Hence, no short circuit occurs between the metallic spacer 71 and the electronic components 75 mounted on respective rigid substrate portions 73. Furthermore, the electronic control device 61 has a case opening 85 at one end thereof. A resin-made alignment plate 87 closes the case opening 85. As shown in FIG. 9, this alignment plate 87 is a rectangular plate member with three parallel slits 89 extending in the horizontal direction.

As understood from FIG. 8, the card edge connectors 74 provided at the edge of respective rigid substrate portions 73 are inserted into the corresponding slits 89 when the alignment plate 87 is assembled with the casing 67.

The base 63 and the cover 65 have recesses 63a and 65a provided on their inner surfaces facing to the case opening 85. The upper and lower ends of the alignment plate 87 are engaged with these recesses 63a and 65a so as to fix the alignment plate 87 to the casing 67.

b) According to this embodiment, as apparent from the foregoing description, the metallic plate spacers 71 interpose between the rigid substrate portions 73 laminated or layered in the up-and-down direction. Therefore, the electronic control device 61 has excellent heat-dissipating properties. Furthermore, the metallic plate spacers 71 can effectively suppress the electric noises or other interference occurring between the electronic components 75 mounted on respective rigid substrate portions 73.

Furthermore, the base 63, the cover 65, and the spacers 71 have the recesses 77, 79, 81, and 83 being configured into the shape corresponding to the electronic components 75 mounted on the rigid substrate portions 73. Therefore, the electronic control device 61 is compact even when the multilayered flexible substrate 69 housed in the casing 67 mounts numerous electronic components 75.

In addition, accurately positioning the card edge connectors 74 is feasible by inserting the card edge connectors 74 into corresponding slits 89 of the alignment plate 87. This ensures the coupling of the card edge connectors 74 and the external connector.

c) Furthermore, this embodiment can be modified in the following manner. For example, the alignment plate 87 can be made of a metallic member. And, it is preferable to maintain the alignment plate 87 at the ground potential (GND) to block any incoming noises.

Maintaining respective spacers 71 at the ground potential (GND) is effective in eliminating any electromagnetic interference occurring between the neighboring rigid substrate portions 73. It is also effective to fill the clearances between the rigid substrate portions 73, the spacers 71, the base 63, and the cover 65 with an appropriate heat-dissipating gel. This will enhance the heat-dissipating properties of the electronic control device 61.

Third Embodiment

Figure 10:
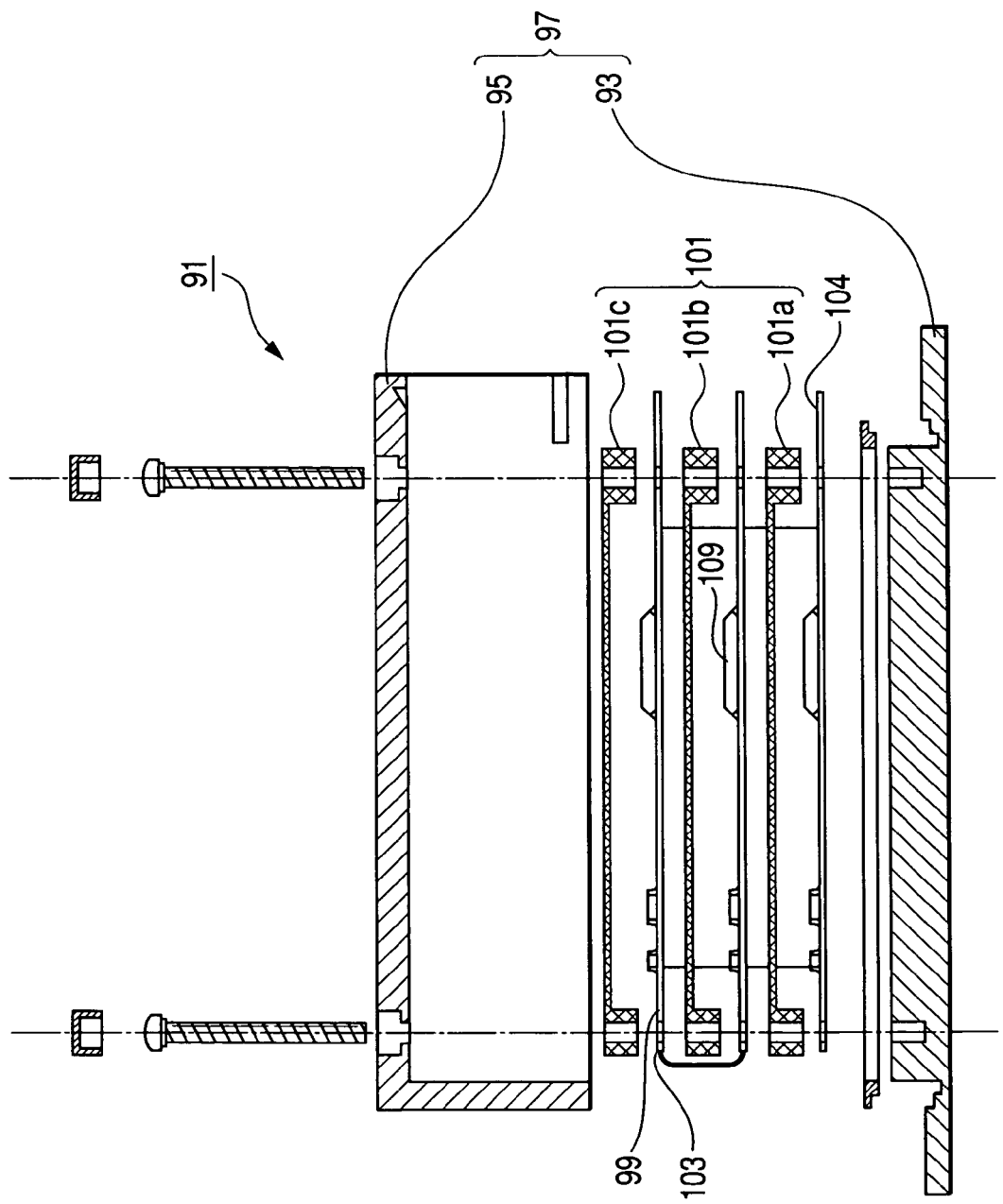
FIG. 10 is a front cross-sectional view showing an exploded state of an electronic control device in accordance with a third embodiment of the present invention.

Next, a third embodiment of the present invention will be explained, although some of the disclosure of the third embodiment is identical with those of the first embodiment and will not be explained again. As shown in FIG. 10, an electronic control device 91 of this embodiment includes a casing 97 consisting of a base 93 and a cover 95. A multilayered flexible substrate 99 and metallic spacers 101a, 101b, and 101c (collectively referred to as spacers 101, hereinafter) are disposed in the casing 97.

According to this embodiment, the multilayered flexible substrate 99 is folded at flexible portions 100a and 100b (collectively referred to as flexible portions 100, hereinafter) so that respective rigid substrate portions 103 and their card edge connectors 104 are disposed so as to form a multilayered arrangement.

Figure 11:
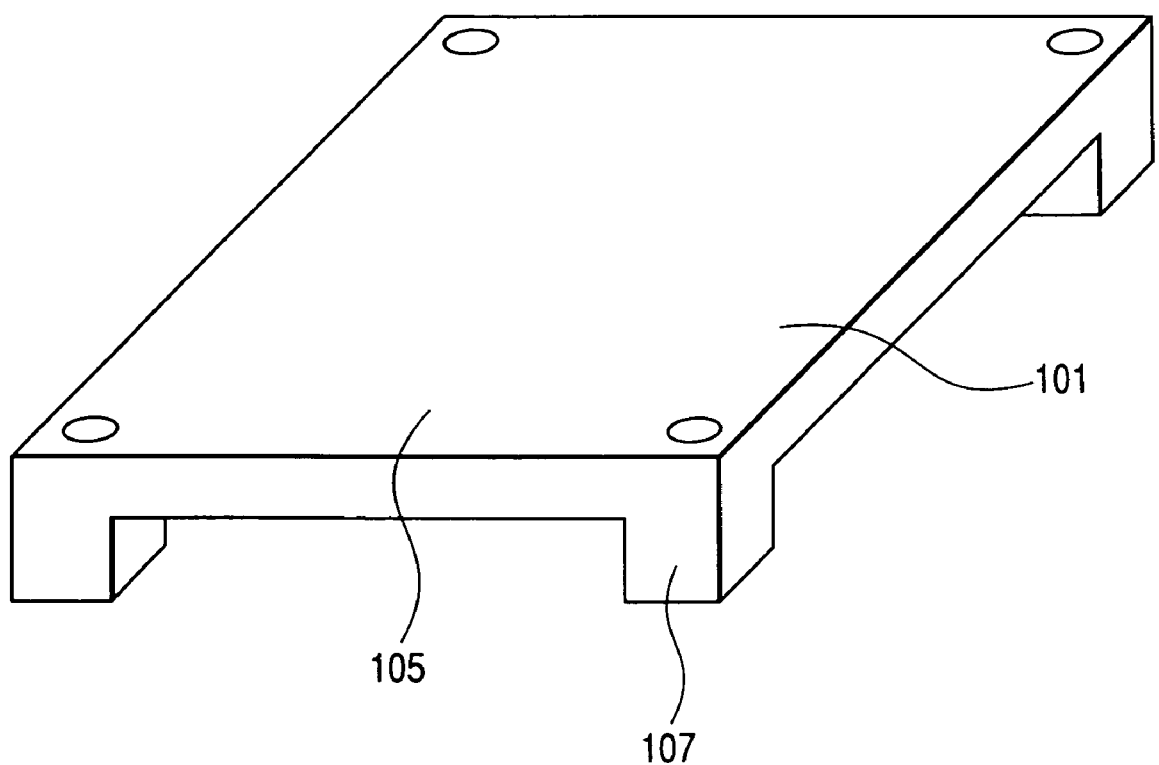
FIG. 11 is a perspective view showing a spacer in accordance with the third embodiment of the present invention.

According to the multilayered flexible substrate 99 of this embodiment, electronic components 109 are mounted on only upper surfaces of respective rigid substrate portions 103. Furthermore, each spacer 101 is a desk-like member as shown in FIG. 11 which consists of a plate portion 105 and pillar portions 107 protruding downward from the lower surface of this plate portion 105 at the four corners.

Accordingly, this embodiment brings the same effects as those of the first embodiment. Mounting no electronic components 109 on one surface of each rigid substrate portion 103 is preferable in that the metallic spacer 101 can be directly placed on (i.e. brought into contact with) the vacant surface of rigid substrate portion 103. This significantly improves the heat-dissipating properties of the electronic control device.

Fourth Embodiment

Next, a fourth embodiment of the present invention will be explained, although some of the disclosure of the fourth embodiment is identical with those of the first embodiment and will not be explained again.

Figure 12:
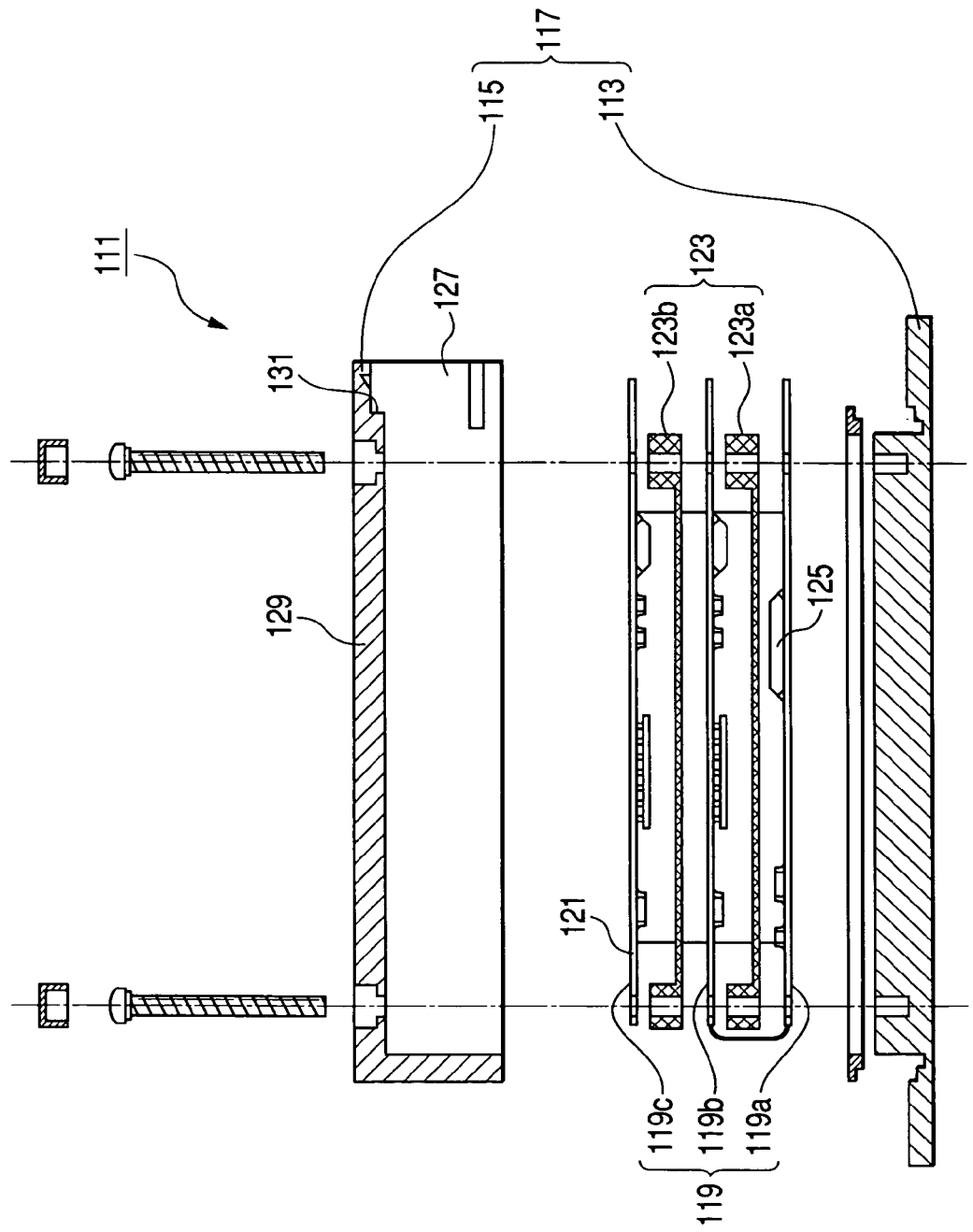
FIG. 12 is a front cross-sectional view showing an exploded state of an electronic control device in accordance with a fourth embodiment of the present invention.
Figure 13:
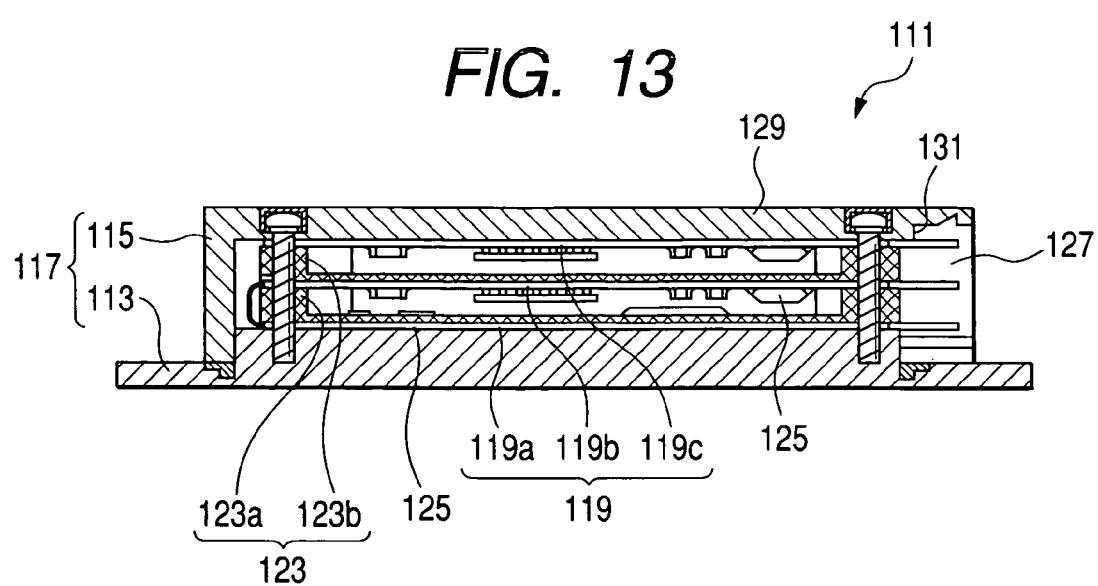
FIG. 13 is a front cross-sectional view showing an assembled condition of the electronic control device in accordance with the fourth embodiment of the present invention.

As shown in FIGS. 12 and 13, an electronic control device 111 of this embodiment includes a casing 117 consisting of a base 113 and a cover 115. A multilayered flexible substrate 121 and a pair of metallic spacers 123a and 123b (collectively referred to as spacers 123, hereinafter) are disposed in the casing 117. The multilayered flexible substrate 121 includes first to third rigid substrate portions 119a, 119b, and 119c (collectively referred to as rigid substrate portions 119, hereinafter).

According to this embodiment, electronic components 125 are disposed on the same surface side of respective rigid substrate portions 119 in a developed or unfolded state of the multilayered flexible substrate 121. Accordingly, when the multilayered flexible substrate 121 is folded and disposed in the casing 117, the electronic components 125 are positioned on the upper surface of the first rigid substrate portion 119a, on the lower surface of the second rigid substrate portion 119b, and the lower surface of the third rigid substrate portion 119c.

Therefore, this embodiment enables the worker or the automated machine to easily mount the electronic components 125 on the same surface side of the developed or unfolded multilayered flexible substrate 121. This improves the workability. Furthermore, in the condition that the multilayered flexible substrate 121 is housed in the casing 117, the electronic components 125 mounted on the third rigid substrate portion 119c face downward. This is preferable in that the spacer to be placed between the third rigid substrate portion 119c and the cover 115 can be omitted. In other words, this embodiment can reduce the total number of required spacers.

Furthermore, according to this embodiment, a step 131 is provided on the inner surface of the cover 115 (i.e. on a ceiling plate 129) at the case opening 127. Therefore, when the external connector is coupled into the case opening 127, the external connector stops at the step 131 and the step 131 can secure a clearance equivalent to the spacer 123. Thus, the coupling between the external connector and the case opening 127 is easy and smooth.

Fifth Embodiment

Next, a fifth embodiment of the present invention will be explained, although some of the disclosure of the fifth embodiment is identical with those of the first embodiment and will not be explained again.

Figure 14:
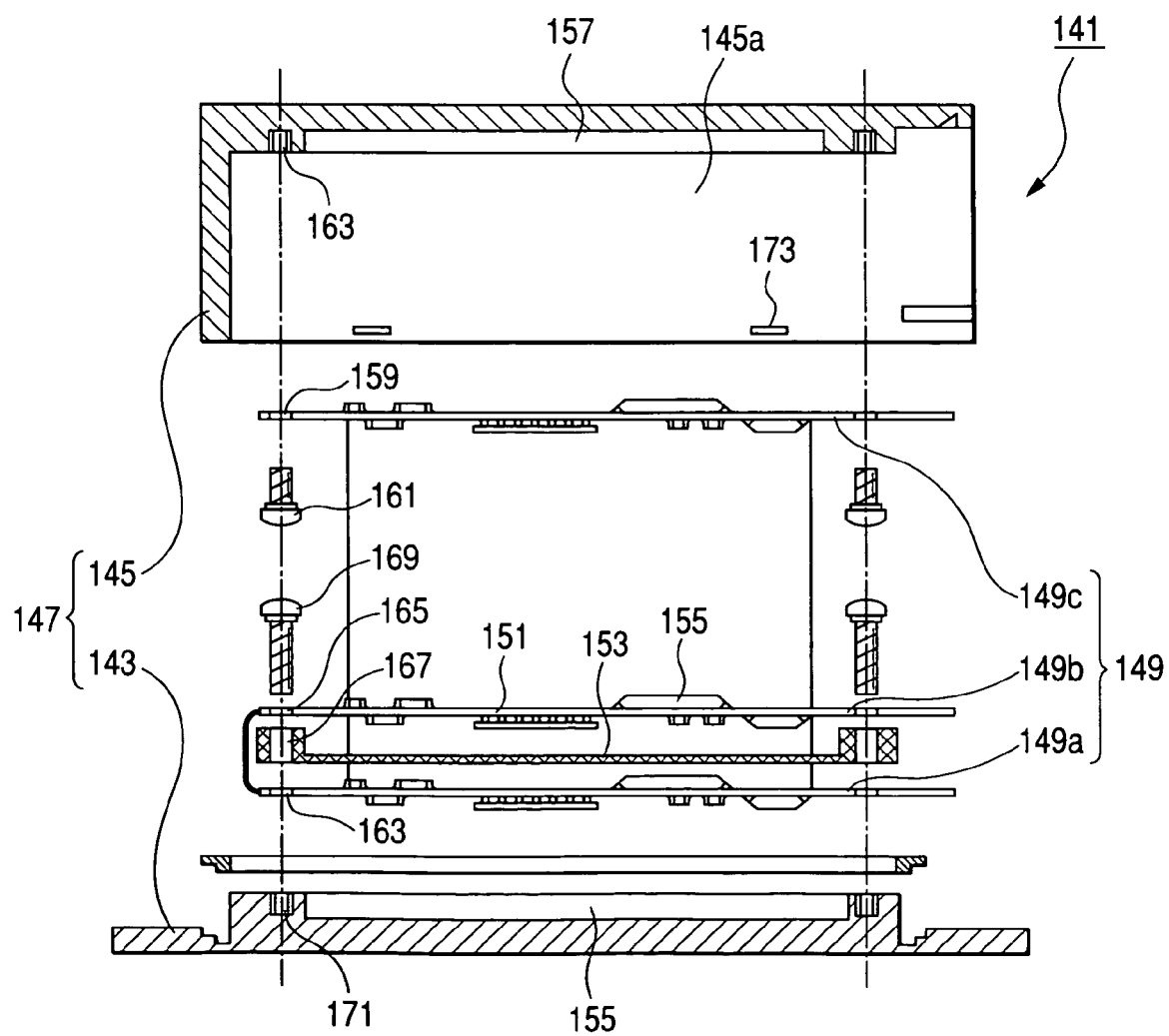
FIG. 14 is a front cross-sectional view showing an exploded state of an electronic control device in accordance with a fifth embodiment of the present invention.

As shown in FIG. 14, an electronic control device 141 of this embodiment includes a casing 147 consisting of a base 143 and a cover 145. A multilayered flexible substrate 151 and a single metallic spacer 153 are disposed in the casing 147. The multilayered flexible substrate 151 includes first to third rigid substrate portions 149a, 149b, and 149c (collectively referred to as rigid substrate portions 149, hereinafter).

According to this embodiment, electronic components 155 are disposed on both surfaces of each rigid substrate portion 149. The base 143 and the cover 145 have cavity portions 155 and 157 formed on their inner surfaces. Furthermore, according to this embodiment, the third rigid substrate portion 149c has through-holes 159 provided at the four corners thereof. Screw members 161 are inserted into the through-holes 159 and tightened into screw holes 163 of the cover 145, thereby firmly fixing the third rigid substrate portion 149c to the cover 145.

Similarly, through-holes 163, 165, and 167 are provided on the first and second rigid substrate portions 149a and 149b and on the spacer 153, respectively, at the four corners thereof. Screw members 169 are inserted into the through-holes 163, 165, and 167 and tightened into screw holes 171 of the base 143, thereby firmly integrating the first and second rigid substrate portions 149a and 149b with the spacer 153 and fixing them to the base 143.

Furthermore, according to this embodiment, the cover 145 has a pair of coupling holes 173 on the inner surfaces of a pair of side plates 145a (disposed in parallel with each other in the direction vertical to the sheet surface). The base 143 has a pair of coupling projections (not shown) on a pair of side surfaces thereof (disposed in parallel with each other in the direction vertical to the sheet surface). Accordingly, when the cover 145 is engaged with the base 143, the coupling projections of the base 143 enter into the coupling holes 173 of the cover 145 so that the cover 145 and the base 143 are integrally fixed.

As apparent from the above-described arrangement, this embodiment facilitates the assembling of the electronic control device 141. Furthermore, according to the electronic control device 141 of this embodiment, the number of required spacers is small. No sealing rubber is required. The total number of parts is small. The cost is low. Furthermore, providing the cavity portions 155 and 157 is preferable in that the electronic components 155 can be mounted on both surfaces of respective rigid substrate portions 149.

Sixth Embodiment

Next, a sixth embodiment of the present invention will be explained, although some of the disclosure of the sixth embodiment is identical with those of the first embodiment and will not be explained again.

Figure 15:
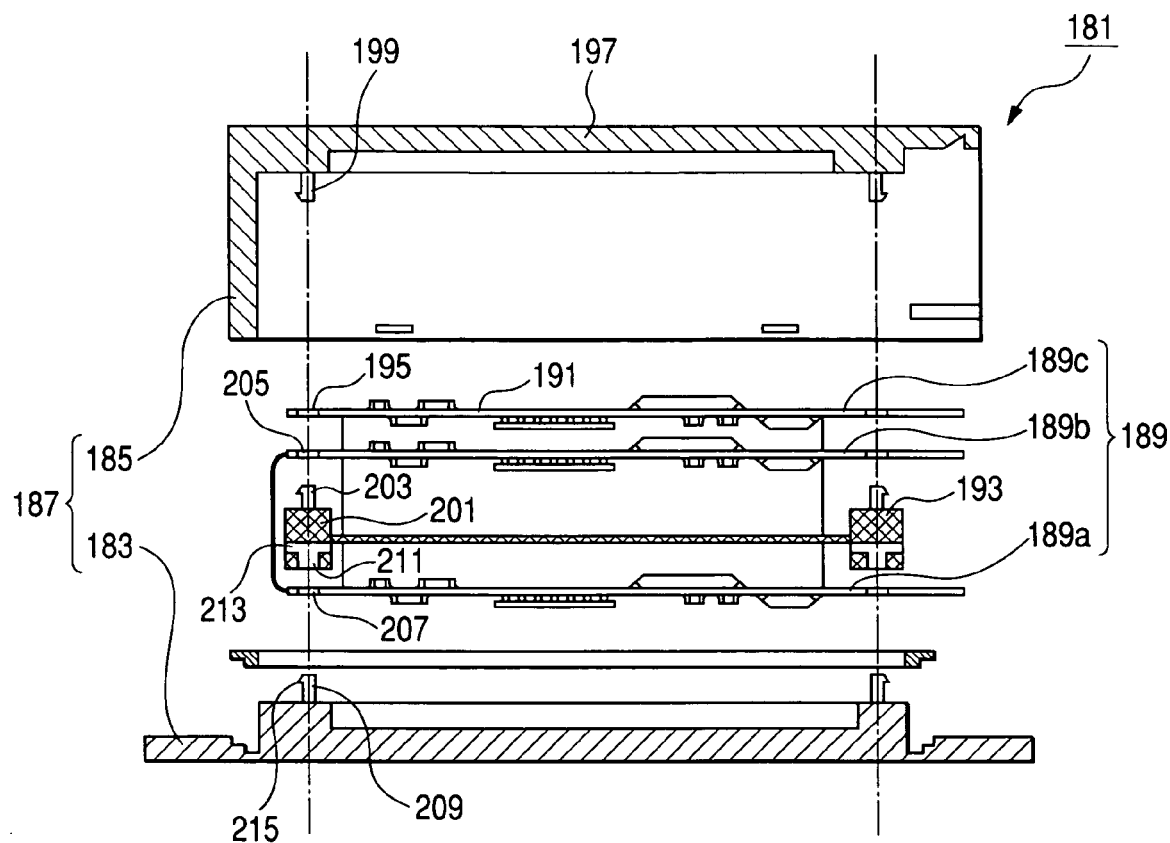
FIG. 15 is a front cross-sectional view showing an exploded state of an electronic control device in accordance with a sixth embodiment of the present invention.

As shown in FIG. 15, an electronic control device 181 of this embodiment includes a resin-made casing 187 consisting of a base 183 and a cover 185. A multilayered flexible substrate 191 and a single resin-made spacer 193 are disposed in the casing 187. The multilayered flexible substrate 191 includes first to third rigid substrate portions 189a, 189b, and 189c (collectively referred to as rigid substrate portions 189, hereinafter).

According to this embodiment, the third rigid substrate portion 189c has through-holes 195 opened at four corners thereof. On the other hand, the cover 185 has fixing projections 199 protruding downward from the lower surface of a ceiling plate 197 so as to correspond to the through-holes 195 at the four corners thereof. Accordingly, by inserting the fixing projections 199 into the through-holes 195 of the third rigid substrate portion 189c, the third rigid substrate portion 189c is fixed to the cover 185.

Figure 16:
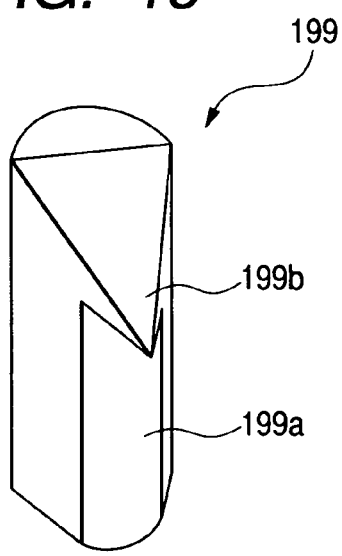
FIG. 16 is a perspective view showing a fixing projection in accordance with the sixth embodiment of the present invention.

As shown in FIG. 16, each fixing projection 199 has a stem portion 199a and a hook 199b formed at the distal end of the stem portion 199a. The hook 199b protrudes in the radial direction. The fixing projection 199 is deformable as a whole when the hook 199b passes the through-hole 195. The hook 199b is engageable with the lower surface of the third rigid substrate portion 189c, thereby fixing the third rigid substrate portion 189c to the cover 185.

Returning to FIG. 15, the spacer 193 has pillar portions 201 provided at the four corners thereof so as to protrude in the up-and-down direction. Each pillar portion 201 has an upper surface from which a fixing projection 203 protrudes upward. The fixing projection 203 is similar in configuration to the fixing projection 199. On the other hand, the second rigid substrate portion 189b has through-holes 205 at the four corners thereof. The through-holes 205 of the second rigid substrate portion 189b correspond to the through-holes 195 of the first rigid substrate portion 189a. Accordingly, the fixing projections 203 are inserted into the corresponding through-holes 205 and engaged with the second rigid substrate portion 189b. Thus, the second rigid substrate portion 189b is fixed to the spacer 193.

Furthermore, the first rigid substrate portion 189a has through-holes 207 at the four corners thereof. On the other hand, the base 183 has fixing projections 209 at the four corners thereof so as to protrude upward. The fixing projections 209 are similar in configuration to the fixing projections 199 of the cover 185. The fixing projections 209 are slightly longer in the axial direction than the fixing projections 199. Furthermore, the pillar portions 201 of the spacer 193 have coupling holes 211 at the lower surfaces thereof. The fixing projections 209 are inserted into the corresponding coupling holes 211. The upper ends of the coupling holes 211 merge into cross holes 213. The cross holes 213 extend perpendicular to the coupling holes 211.

Accordingly, the fixing projections 209 are inserted into the through-holes 207 and coupled into the coupling holes 211 of the spacer 193. The fixing projections 209 have hooks 215 engaging with the cross holes 213 so that the first rigid substrate portion 189a is fixed to the base 183.

When the fixing projections 209 fix the spacer 193 to the base 183, the second rigid substrate portion 189b is fixed to the base 183 together with the spacer 193.

According to the above-described arrangement, this embodiment requires no screws for fixing the parts. The electronic control device 181 of this embodiment is easy to assemble and disassemble. Furthermore, the number of required spacers is small. No sealing rubber is required. The total number of parts is small. The cost is low.

Figure 17:
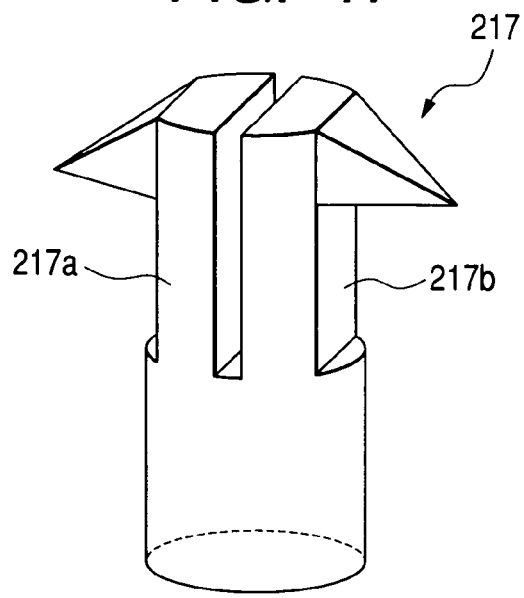
FIG. 17 is a perspective view showing another fixing projection in accordance with the sixth embodiment of the present invention.

FIG. 17 shows another fixing projection 217 which is replaceable with the fixing projections 199 and 209 (or with the fixing projection 203). This fixing projection 217 has two separated head portions 217a and 217b so as to have excellent elasticity. Therefore, the fixing projection 217 can easily bend and ensure coupling with other parts.

Seventh Embodiment

Next, a seventh embodiment of the present invention will be explained, although some of the disclosure of the seventh embodiment is identical with those of the first embodiment and will not be explained again.

Figure 18:
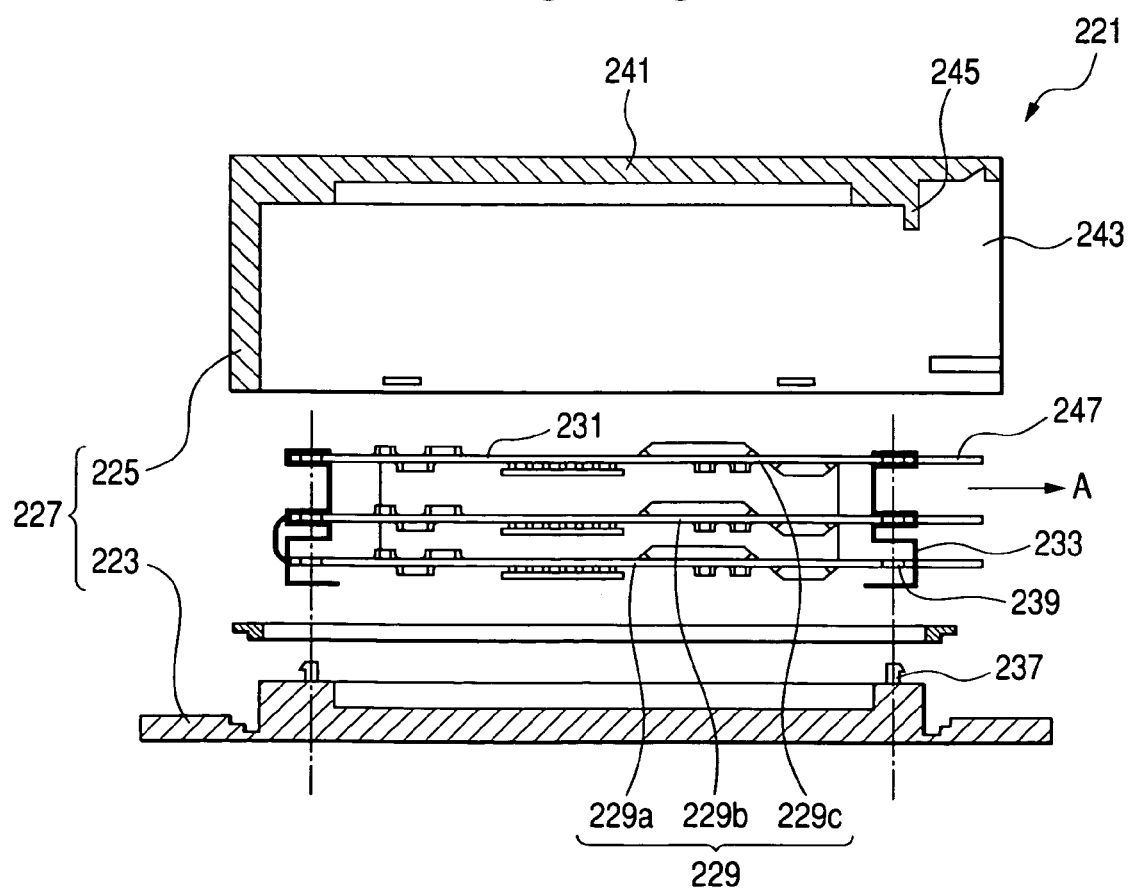
FIG. 18 is a front cross-sectional view showing an exploded state of an electronic control device in accordance with a seventh embodiment of the present invention.

As shown in FIG. 18, an electronic control device 221 of this embodiment includes a casing 227 consisting of a base 223 and a cover 225. A multilayered flexible substrate 231 and a total of four metallic spacers 233 are disposed in the casing 227. The multilayered flexible substrate 231 includes first to third rigid substrate portions 229a, 229b, and 229c (collectively referred to as rigid substrate portions 229, hereinafter).

Figure 19:
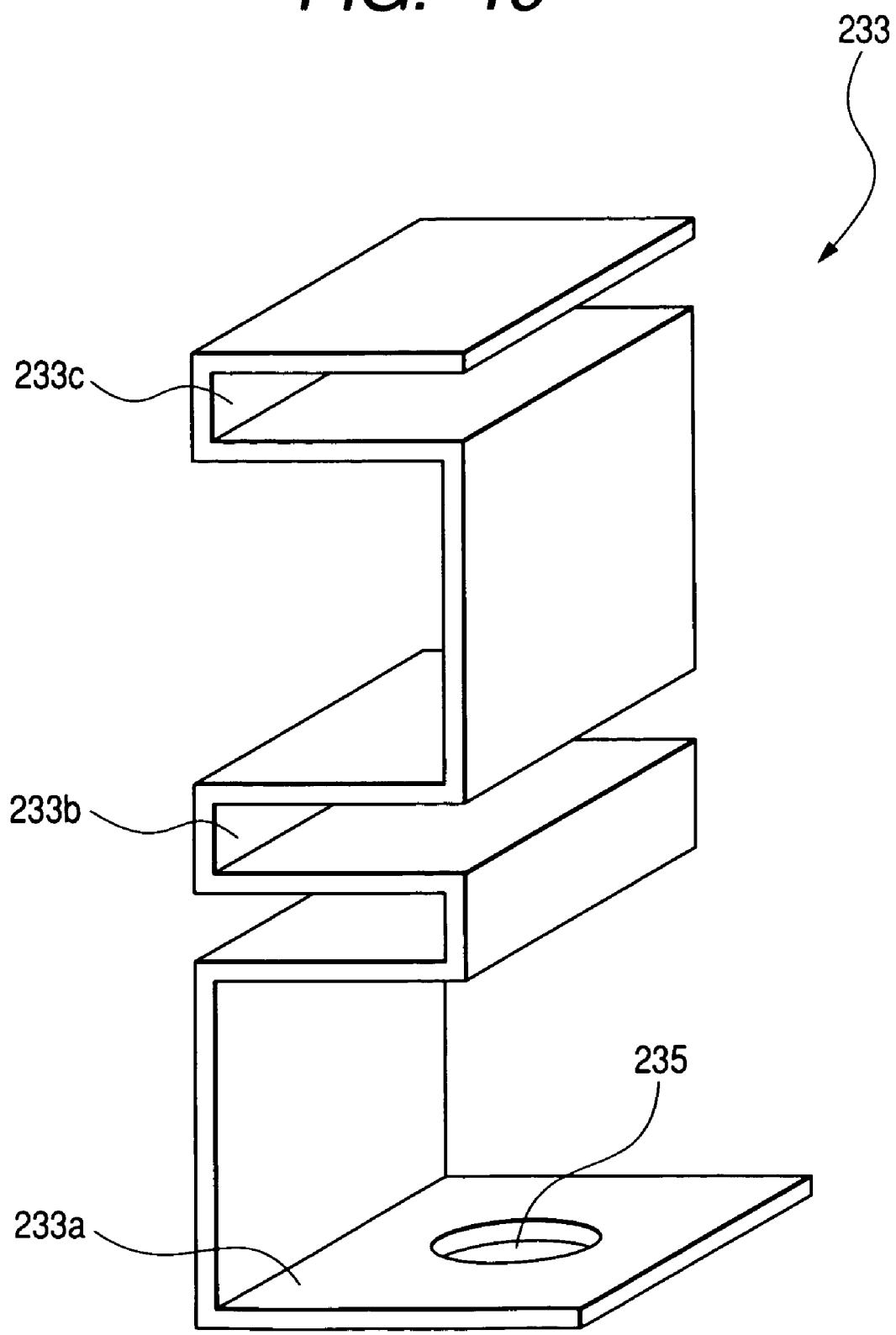
FIG. 19 is a perspective view showing a spacer in accordance with the seventh embodiment of the present invention.

The metallic spacers 233 of this embodiment are disposed at the four corners of respective rigid substrate portions 229 so as to extend in the up-and-down direction. As shown in FIG. 19, each spacer 233 is a metallic plate bent perpendicularly at a plurality of portions and configured into a predetermined shape. Due to such a crooked configuration, the spacers 233 can hold respective rigid substrate portions 229 with predetermined gaps. Each spacer 233 has a through-hole 235 opened at a lower plate 233a thereof.

More specifically, the lower plate 233a of the spacer 233 supports the first rigid substrate portion 239a. A first recess 233b of the spacer 233 supports the second rigid substrate portion 239b. A second recess 233c of the spacer 233 supports the third rigid substrate portion 239c.

Returning to FIG. 18, the base 223 has fixing projections 237 at the four corners thereof. The fixing projections 237 are similar to those of the above-described sixth embodiment. These fixing projections 237 are inserted into the spacer through-hole 235 of the spacer 233 and engaged with through-holes 239 provided at the four corners of the first rigid substrate portion 229a. Thus, the base 223, the spacer 233, and the first rigid substrate portion 229a are integrally fixed.

According to the above-described arrangement, the electronic control device 221 of this embodiment is easy to assemble and disassemble. Furthermore, according to this embodiment, the cover 225 has a pair of stoppers 245 provided on a ceiling plate 241. The stoppers 245 protrude downward from the inner surface of the case opening 243. The stoppers 245, provided at both sides of the case opening 243 in the direction perpendicular to the sheet surface, protrude with the width corresponding to the spacers 233. Thus, the stoppers 245 can block the movement of the spacers 233.

When the external connector (not shown) is disengaged from the card edge connectors 247 of the multilayered flexible substrate 231, a significant amount of stress may act on the card edge connectors 247 in the direction of arrow A. However, the stoppers 245 surely prevent any undesirable slide movement of the spacers 233. In other words, the stoppers 245 can relax or reduce the tensile stress.

Eighth Embodiment

Next, an eighth embodiment of the present invention will be explained, although some of the disclosure of the eighth embodiment is identical with those of the first embodiment and will not be explained again.

Figure 20:
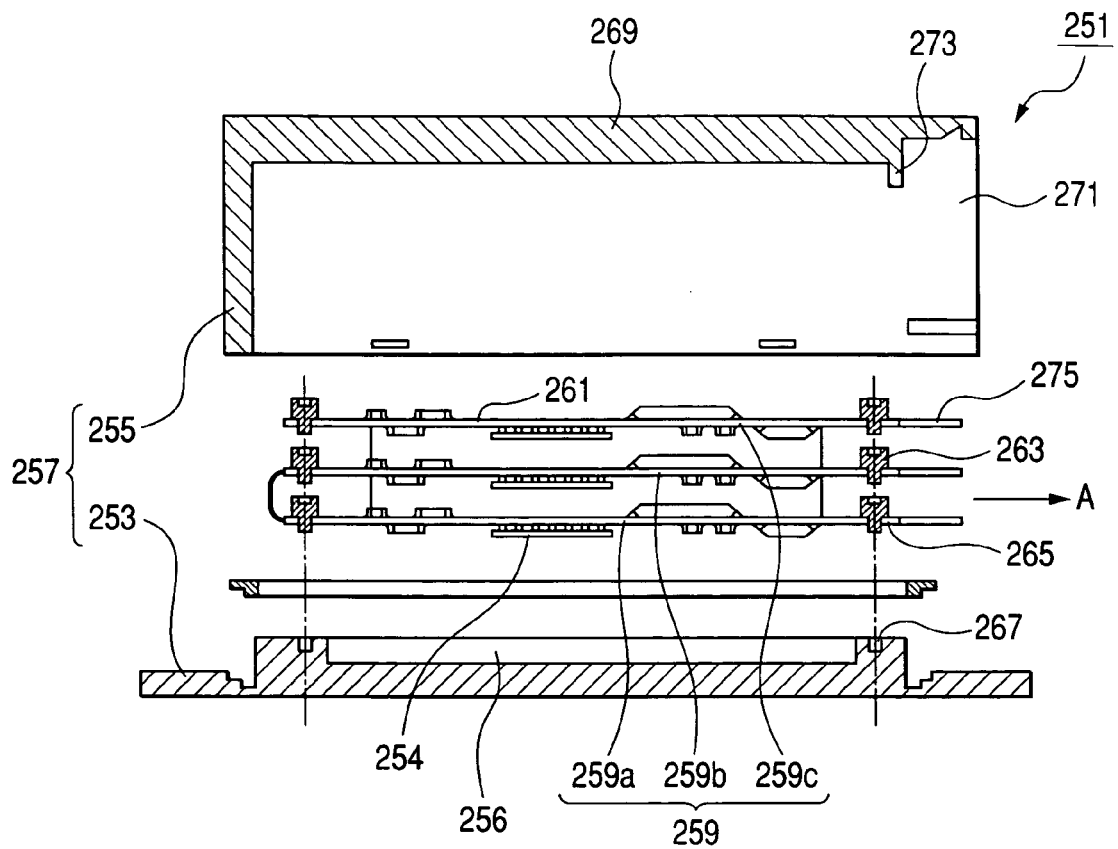
FIG. 20 is a front cross-sectional view showing an exploded state of an electronic control device in accordance with an eighth embodiment of the present invention.

As shown in FIG. 20, an electronic control device 251 of this embodiment includes a casing 257 consisting of a base 253 and a cover 255. A multilayered flexible substrate 261 and a total of 12 resin-made spacers 263 are disposed in the casing 257. The multilayered flexible substrate 261 includes first to third rigid substrate portions 259a, 259b, and 259c (collectively referred to as rigid substrate portions 259, hereinafter). The base 253 has a cavity portion 256 on the inner surface thereof which is provided to avoid interference with electronic components 254.

Figure 21:
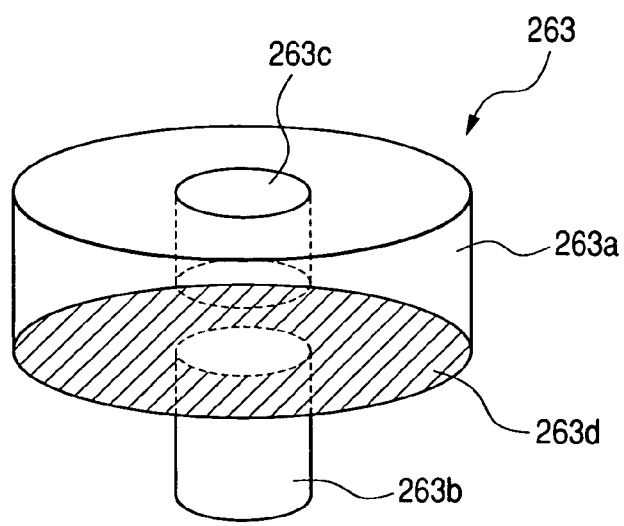
FIG. 21 is a perspective view showing a spacer in accordance with the eighth embodiment of the present invention.

The spacers 263 of this embodiment are bonded to the four corners of respective rigid substrate portions 259 by soldering. As shown in FIG. 21, each spacer 263 has a cylindrical pillar portion 263a, a projection 263b protruding from the lower surface of the cylindrical pillar portion 263a, and a recess 263c opened on the upper surface of the cylindrical pillar portion 263a. A plated surface 263d is provided on the lower surface of the cylindrical pillar portion 263a (around the projection 263b).

Returning to FIG. 20, respective rigid substrate portions 259 have through-holes 265 provided at the four corners thereof. Each through-hole 265 can receive the projection 263b of a corresponding spacer 263. The plated surface 163d of the spacer 263 is directly brought into contact with the upper surface of each rigid substrate portion 259.

The base 253 has coupling holes 267 opened at the four corners thereof. The projections 263b of the spacers 263 protruding downward from the lower surface of the first rigid substrate portion 259a are coupled into the coupling holes 267 of the base 253. The projections 263b of the spacer 263 protruding downward from the lower surface of the second rigid substrate portion 259b are coupled into the recesses 263c opened on the spacers 263 protruding upward from the first rigid substrate portion 259a. Similarly, the projections 263b of the spacer 263 protruding downward from the lower surface of the third rigid substrate portion 259c are coupled into the recesses 263c opened on the spacers 263 protruding upward from the second rigid substrate portion 259b. In this manner, first to third rigid substrate portions 259 are successively laminated or layered with predetermined gaps.

According to the above-described arrangement, the electronic control device 251 of this embodiment is easy to assemble and disassemble. Furthermore, the multilayered flexible substrate 261 can be easily held in a crooked condition. The workability and productivity can be improved.

More specifically, it is preferable to perform the soldering operation of the spacers 263 in the process of mounting the electronic components 254. The process of mounting the electronic components 254 and the process of bonding the spacers 263 can be carried out as a sequential work. The workability can be further improved.

Furthermore, according to this embodiment, the cover 255 has a pair of stoppers 273 provided on a ceiling plate 269. The stoppers 273 protrude downward from the inner surface of the case opening 271. The stoppers 273, provided at both sides of the case opening 271 in the direction perpendicular to the sheet surface, protrude with the width corresponding to the spacers 263. Thus, the stoppers 273 can block the movement of the spacers 263.

When the external connector (not shown) is disengaged from the card edge connectors 275 of the multilayered flexible substrate 261, a significant amount of stress may act on the card edge connectors 275 in the direction of arrow A. However, the stoppers 273 surely prevent any undesirable slide movement of the spacers 263. In other words, the stoppers 263 can relax or reduce the tensile stress.

It is also possible to couple the projections 263b of respective spacers 263 into the through-hole 265 of the rigid substrate portions 259 without providing the plated surface 263d. Furthermore, each spacer 263 can be placed upside down. It is also preferable to provide coupling holes on the cover 255 into which the projections 263b of the spacer 263 are coupled. Furthermore, to omit the cavity portion 256, it is preferable to adequately adjust the length of each projection 263b of the spacer 263

Ninth Embodiment

Next, a ninth embodiment of the present invention will be explained, although some of the disclosure of the ninth embodiment is identical with those of the first embodiment and will not be explained again.

Figure 22:
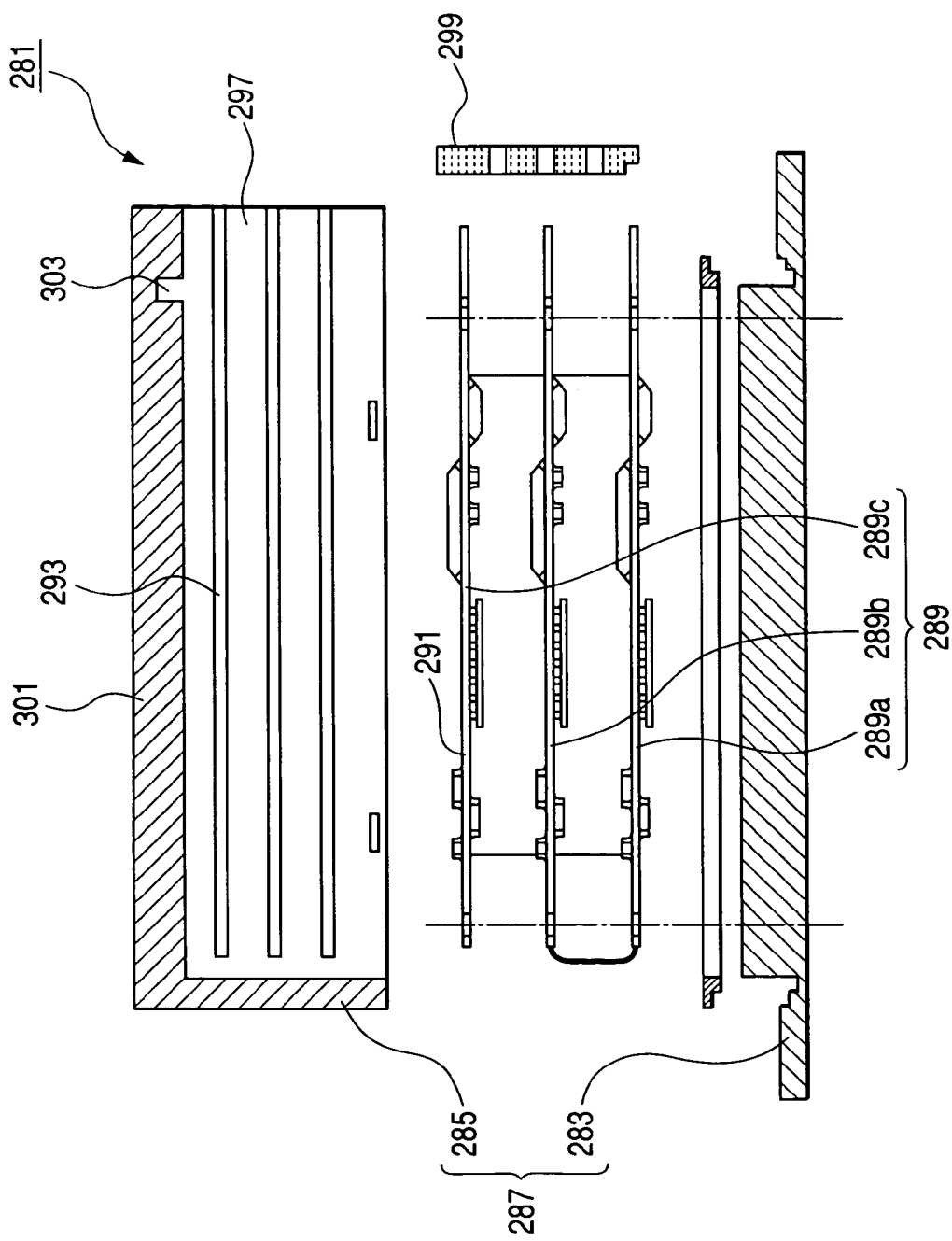
FIG. 22 is a front cross-sectional view showing an exploded state of an electronic control device in accordance with a ninth embodiment of the present invention.
Figure 25:
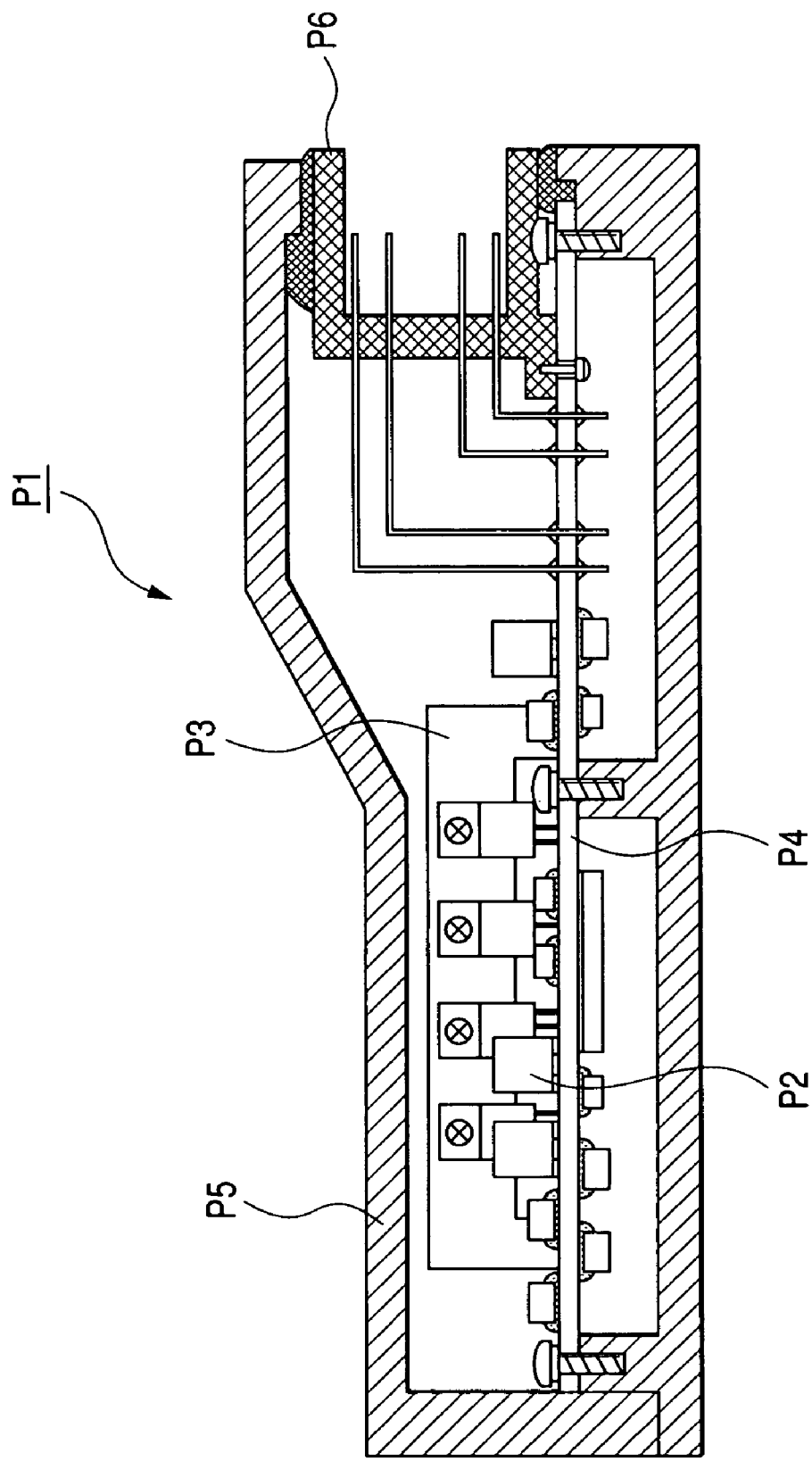
FIG. 25 is a cross-sectional view showing a conventional electronic control device.

As shown in FIG. 22, an electronic control device 281 of this embodiment includes a casing 287 consisting of a base 283 and a cover 285. A multilayered flexible substrate 291 including first to third rigid substrate portions 289a, 289b, and 289c (collectively referred to as rigid substrate portions 289, hereinafter) is disposed in the casing 287.

The cover 285 has an inner surface on which slide grooves 293 are formed horizontally. The altitudinal positions of these slide grooves 293 correspond to respective rigid substrate portions 289 of the multilayered flexible substrate 291. Furthermore, as shown in FIG. 23A, respective rigid substrate portions 289 of the multilayered flexible substrate 291 have slide fixing flanges 295 protruding from both sides thereof. The slide fixing flanges 295 are coupled into the slide grooves 293 of the cover 285. More specifically, each rigid substrate portion 289 has a pair of slide fixing flanges 295 provided at each of the right and left sides thereof. The slide fixing flanges 295 extend in a direction perpendicular to the sheet surface of FIG. 22 when the corresponding rigid substrate portion 289 is disposed in the casing 287. Providing these slide fixing flanges 295 is effective in preventing the flexible portions 294 from colliding and interfering with the casing 287 or the like during the slide movement of the rigid substrate portions 289. Regarding the position of respective rigid substrate portions 289 constituting the multilayered flexible substrate 291, it is preferable to adopt the arrangement shown in FIG. 23B.

According to this embodiment, when the multilayered flexible substrate 291 is folded and inserted into the casing 287 from the case opening 297, the slide fixing flanges 295 of respective rigid substrate portions 289 are forcibly coupled into the slide grooves 293. Thus, the assembling of the electronic control device 281 can be easily accomplished without causing any interference.

Furthermore, like the above-described second embodiment, this embodiment uses a resin-made alignment plate 299 covering the case opening 297. The ceiling plate 301 of the cover 285 has a fixing groove 303 provided on its inner surface. An upper edge of the alignment plate 299 is coupled into the fixing groove 303.

According to the above-described arrangement, the electronic control device 281 of this embodiment is easy to assemble and disassemble. Furthermore, the multilayered flexible substrate 291 can be easily held in a crooked condition. The workability and productivity can be improved.

Tenth Embodiment

Next, a tenth embodiment of the present invention will be explained, although some of the disclosure of the tenth embodiment is identical with those of the first embodiment and will not be explained again.

As shown in FIG. 24, an electronic control device 311 of this embodiment includes a resin-made casing 317 consisting of a base 313 and a cover 315 which are integrally formed. A multilayered flexible substrate 319 and an alignment plate 321 are disposed in the casing 317.

The casing 317 has fixing grooves 325 and 327 provided on the upper and lower inner surfaces thereof. The fixing grooves 325 and 327 are located in the vicinity of a case opening 323 of the casing 317. According to this embodiment, the integrally formed casing 317 is simple in the arrangement. Thus, this embodiment can simplify the assembling of the electronic control device 311.

The present invention is not limited to the above-described embodiments and accordingly can be modified in various ways within the scope of the present invention.

(1) For example, the electronic components mounted on the rigid substrate portion are Si-back packaged components which can improve the heat transfer efficiency and accordingly improve the heat-dissipating properties of the electronic components.

(2) Furthermore, the terminal directions of respective card edge connectors can be arbitrarily changed so that the connector attaching/detaching direction can be changed considering various circuit functions (for example, input and output). As a result, the wiring length between the electronic control device and other devices installed in an automotive vehicle can be optimized.

(3) Furthermore, it is preferable to mount the electronic components having the same or similar functions on the same rigid substrate portion. For example, one rigid substrate portion mounts electronic components relating to electric power supply, while another rigid substrate portion mounts electronic components relating to calculations. Separating the electronic components according to their power conditions or capacities is effective in suppressing the interference noises occurring between the electronic components and also reducing the interference noises occurring between the card edge connectors.

(4) Regarding the screw members, they should be provided appropriately at the portions so as to correspond to the members to be connected or fastened.

What is claimed is:

1. An electronic control device comprising:
   a casing;
   a multilayered flexible substrate accommodated in the casing, wherein the multilayered flexible substrate includes i) a plurality of rigid substrate portions mounting electronic components thereon and ii) a flexible portion being flexible and bendable and connected to a first end of each of the rigid substrate portions to provide an electrical connection between or among said rigid substrate portions; and
   a plurality of card edge connectors, wherein one of the edge connectors is integrally formed with a second end of each of said rigid substrate portions, and wherein said multilayered flexible substrate is folded at said flexible portions so that said rigid substrate portions are disposed in a multilayer arrangement in a thickness direction of each of the rigid substrate portions,
   the multilayer arrangement allows i) the flexible portion to be positioned and bent outside the plurality of rigid substrate portions arranged in the multilayer arrangement and ii) the card edge connectors to be positioned to protrude outward from each of the second ends of the rigid substrate portions arranged in the multilayer arrangement, and
   the folded flexible portion has a length in a planar direction perpendicular to the thickness direction that is less than a protruded length of the card edge connectors.

2. The electronic control device in accordance with claim 1, wherein terminal directions of said card edge connectors provided on respective rigid substrate portions are differentiated for individual rigid substrate portions.

3. The electronic control device in accordance wit claim 1, wherein said electronic components are Si-back packaged components.

4. The electronic control device in accordance with claim 1, wherein electronic components having same or similar functions are mounted on the same rigid substrate portion so that electromagnetic interference occurring between the electronic components can be suppressed.

5. The electronic control device in accordance with claim 1, wherein said casing is a metallic casing.

6. The electronic control device in accordance with claim 1, wherein said rigid substrate portions are fixed to said casing with screw members.

7. The electronic control device in accordance with claim 1, wherein said casing has fixing projections provided on its inner surface and at least one of said rigid substrate portions is fixed to said casing via said fixing projections.

8. The electronic control device in accordance with claim 1, wherein at least one spacer is disposed between said rigid substrate portions, and said spacer has fixing projections for fixing at least one of said rigid substrate portions.

9. The electronic control device in accordance with claim 1, wherein said casing has fixing projections provided on its inner surface, at least one spacer is disposed between said rigid substrate portions, and said spacer has engaging portions engageable with said fixing projections of the casing to fix said spacer to said casing.

10. The electronic control device in accordance with claim 1, wherein at least one spacer is disposed between said rigid substrate portions, and said spacer is a metallic plate member bent into a crooked configuration for holding said rigid substrate portions.

11. The electronic control device in accordance with claim 1, wherein said casing has slide grooves provided on its inner surface to receive side edges of said rigid substrate portions.

12. The multilayer electronic circuit device of claim 1, wherein the first end is different from the second end in every rigid substrate portion.

13. The electronic control device in accordance with claim 11, wherein said casing is an integrally formed member having a case opening at one end and slide grooves formed in its inner surface so that said rigid substrate portions are entered from said case opening and guided along said slide grooves.

14. The multilayer electronic circuit device of claim 12, wherein the second ends of all the rigid substrate portions are directed in the same direction perpendicular along the planar direction.

15. The electronic control device in accordance with claim 14, wherein said card edge connectors are provided on at least two of said rigid substrate portions, and said card edge connectors are arranged along their terminal directions so as to form a multilayered arrangement when said multilayered flexible sub state is folded to form a multilayered arrangement of said rigid substrate portions.

16. The electronic control device in accordance with claim 14, wherein said casing has a case opening at its edge so that said card edge connectors are exposed in said case opening.

17. The electronic control device in accordance with claim 14, wherein spacers are disposed between said rigid substrate portions.

18. The electronic control device in accordance with claim 14, wherein said casing is a resin-made casing.

19. The electronic control device in accordance with claim 14, wherein said casing is a combination of a first casing member and a second casing member disposed in a laminating direction of said rigid substrate portions, and said multilayered flexible substrate is housed in a space defined by said first casing member and said second casing member.

20. The electronic control device in accordance with claim 14, wherein spacers are disposed between said rigid substrate portions, and said spacers are members fixed beforehand on a surface of respective rigid substrate portions.

21. The electronic control device in accordance with claim 16, wherein an alignment member is disposed at said case opening so as to close said case opening, and respective card edge connectors extend out of said alignment member through a plurality of through-holes of said alignment member.

22. The electronic control device in accordance with claim 17, wherein said spacers are resin-made spacers.

23. The electronic control device in accordance with claim 17, wherein said spacers are metallic spacers.

24. The electronic control device in accordance wit claim 19, wherein said first casing member and said second casing member are connected together with casing screw members extending across at least one of said first casing member and said second casing member.

25. The electronic control device in accordance with claim 19, wherein said first casing member has coupling projections or coupling recesses and said second casing member has coupling recesses or coupling projections, and said first casing member and said second casing member are connected by engaging said coupling projections or coupling recesses of said first casing member with said coupling recesses or coupling projections of said second casing member.

26. The electronic control device in accordance with claim 22, wherein a metallic collar is disposed in respective resin-made spacers so as to extend in a laminating direction of said resin-made spacers.

27. The electronic control device in accordance with claim 23, wherein said spacers are plate members covering surfaces of said rigid substrate portions.

28. The electronic control device in accordance with claim 23, wherein electronic components are mounted on one surface of said rigid substrate portions and no electronic components are mounted on the other surface of said rigid substrate portions, and said metallic spacers are disposed so as to contact with said other surface of said rigid substrate portions.

29. The electronic control device in accordance wit claim 23, wherein said metallic spacers have a ground potential.

30. The electronic control device in accordance with claim 23, wherein a clearance between said rigid substrate portions and said spacers is filled with a heat-dissipating gel.

31. The electronic control device in accordance with claim 24, wherein at least one spacer is disposed between said rigid substrate portions, and said spacer has spacer through-holes into which said casing screw members are inserted.

32. The electronic control device in accordance with claim 24, wherein at least one spacer is disposed between said rigid substrate portions, and said rigid substrate portions have substrate through-holes into which said casing screw members are inserted.

33. The electronic control device in accordance with claim 27, wherein said spacers have recesses which do not interfere with electronic components mounted on said rigid substrate portions.

34. An multilayer electronic circuit device comprising:
a casing;
a multilayered flexible substrate accommodated in the casing, the multilayered flexible substrate including i) a plurality of rigid substrate portions mounting electronic components thereon and ii) a flexible portion being flexible and bendable and connected to a first end of each of the rigid substrate portions to provide an electrical connection between or among said rigid substrate portions; and
a plurality of card edge connectors each integrally formed with a second end of each of said rigid substrate portions,
wherein said multilayered flexible substrate is folded at said flexible portion so that said rigid substrate portions are disposed in a multilayer arrangement in a thickness direction of each of the rigid substrate portions,
the multilayer arrangement allows i) the flexible portion to be positioned and bent outside the plurality of rigid substrate portions arranged in the multilayer arrangement and ii) the card edge connectors to be positioned to protrude outward from each of the second ends of the rigid substrate portions arranged in the multilayer arrangement, and
the second ends of all the rigid substrate portions are directed in the same direction perpendicular along a planar direction perpendicular to the thickness direction.

35. The multilayer electronic circuit device of claim 34, wherein the first end is different from the second end in every rigid substrate portion.

36. The multilayer electronic circuit device of claim 34, wherein the second end is positioned at a predetermined edge portion of each rigid substrate portion so as to enable the second ends of all the rigid substrate portions to be directed in the same direction perpendicular along the planar direction, when the plurality of the rigid substrate portions are folded on a predetermined folding sequence rule.

* * * * *